United States Patent [19]

Addesso et al.

[11] Patent Number: 5,019,961
[45] Date of Patent: May 28, 1991

[54] COMPUTER APPARATUS AND METHOD FOR LOGICAL MODELLING

[75] Inventors: Mark Addesso, Hamden; Venkatraman R. Iyer, New Haven; Robert M. Dunn, Redding, all of Conn.

[73] Assignee: Cadware, Inc., New Haven, Conn.

[21] Appl. No.: 334,080

[22] Filed: Apr. 5, 1989

[51] Int. Cl.$^5$ .............................................. G06F 15/46
[52] U.S. Cl. .................................... 364/192; 364/521
[58] Field of Search ................... 364/192, 188, 474.24, 364/512, 522, 521, 578, 729, 200, 900, 488, 189

[56] References Cited

U.S. PATENT DOCUMENTS

| | | | |
|---|---|---|---|
| 4,697,239 | 9/1987 | Sicard et al. | 364/468 |
| 4,700,317 | 10/1987 | Watanabe et al. | 364/512 |
| 4,831,546 | 5/1989 | Mitsuta | 364/512 |

Primary Examiner—Clark A. Jablon
Assistant Examiner—Paul Gordon
Attorney, Agent, or Firm—Barry R. Lipsitz

[57] ABSTRACT

A computer based modelling system includes a computer processor and a memory for storing a model database. A set of primitives is stored in the database. An interface coupled to the computer processor enables a user to input, retrieve and manipulate data within the database. A high level user of the modelling system creates a modelling methodology by editing the database to define: (a) modelling objects in terms of the primitives, (b) modes of viewing the modelling objects, and (c) logical relationships between elements of the views and the modelling objects. A system modeler can create models for specific applications by selecting views representative of modelling objects stored in the database, and manipulating the views in accordance with the methodology defined by the system tooler. Invalid manipulations are prohibited. Policies of coordination can be established among a plurality of modeling sessions of one or more low level users. The system database has a recursive structure, whereby a change made to a first object or view will initiate corresponding changes in every other object or view logically related to the first object or view.

30 Claims, 15 Drawing Sheets

COMPUTER APPARATUS AND METHOD FOR LOGICAL MODELLING

The present application includes a microfiche appendix containing 4 fiche and 378 frames.

BACKGROUND OF THE INVENTION

The present invention relates to computer modelling systems, and more particularly to a computer system and method for logical modelling.

Prior to making a large-scale investment in a new process, system, physical structure, or the like, it is useful to create a model thereof so that simulations and analysis can be performed before constructing the end product. For example, architects often use models of new buildings to evaluate feasibility, and to present their design concepts to the client. More complex models are used by engineers in designing chemical plants, vehicles such as automobiles and aircraft, and other complicated structures.

Computer modelling has been successfully applied to various modelling endeavors, and is useful in evaluating physical properties of a model, such as the exact orientation and fitting of parts, as well as the performance of the item being modelled in its final intended environment. Such modelling systems are often referred to as CAD/CAM systems.

In a different application area, database technology has been employed to create models of businesses, business transactions, inventory, and the like. Such systems are referred to as "information systems". Database technology used in such systems has progressed from hierarchical means of database management, to network, relational, and most recently object oriented management. Such information modelling systems typically use a "forms" interface for data entry and reporting. Data is generally entered one object at a time, and reporting is used to print and display a cross section of the database.

There has recently emerged a concept of a more sophisticated modelling system in which logical techniques are used in the creation of a model. Logical modelling is similar to information modelling in that a primary concern is to create objects which represent things in the world and then to describe the relationships between these objects. Like CAD/CAM modelling, the best interface to use with a logical modelling system is graphical due to the number and complexity of the relationships between objects. To date, logical modelling systems have relied very heavily on schematic diagrams to model the system being built. Such diagrams are quite different from those in the CAD/CAM world in that they show relationships between objects rather than physical descriptions of an object. While in CAD/CAM modelling, the graphical location of the objects greatly effects the meaning of the model, the same model can be expressed with many different diagrams in logical modelling. Moving objects around in the logical modelling environment will generally have absolutely no effect on the model.

Logical modelling is concerned with rules about logical structure. An example of such a rule in a process model may be that one piece of data must go into and out of a process entity. In a computer network configuration model, such a rule may require the presence of certain pieces of hardware, or may invalidate the use of other pieces of hardware. Violation of such rules in the logical modelling environment is not tolerated.

Past attempts at logical modelling have focused primarily on the graphical representation of objects in the model. Each aspect of the model was specified in isolation, with no meaningful interconnections between the objects that could be subsequently used in connection with an evaluation of the structure and/or behavior of the model. Although such logical modelling systems contained powerful graphics capabilities, they have been unable to provide easily evaluatable results which could be subsequently used to actually control a process, manufacture a product, or, in the software engineering environment, generate actual computer code implementing the end result that the model was created to simulate.

An example of such a prior system in which the focus is on the graphical representation of objects is disclosed in commonly assigned U.S. Pat. Nos. 4,656,603 and 4,813,013, both entitled *Schematic Diagram Generating Systems Using Library of General Purpose Interactively Selectable Graphic Primitives to Create Special Applications Icons*, and incorporated by reference herein.

It would be advantageous to provide a logical modelling system in which the structure and behavior of models created thereby can be evaluated and ultimately used to implement the thing being modelled. In such a system, the underlying database would contain not just information about the objects in the database, but would also contain data indicative of how the objects are correlated to provide evaluatable models.

It would be further advantageous if the graphics used as the interface between the modelling system and the end user did not simply specify the objects being modelled, as in the past, but were instead used to provide a form of communication for the user to and from the underlying database. In this manner, a user could actually view the database through the graphic interface.

It would be further advantageous to provide tools to enable a modelling methodology to be created for the subsequent creation of intended models. Such tools would, in effect, provide a database editor for the underlying database of the logical modelling system. Such tools would be more useful than past tools that provided for specification techniques (i.e., how to specify things about objects in the modelling system) rather than providing for the creation of modelling methodologies.

It would be further advantageous to provide such a logical modelling system wherein policies of coordination can be established among a plurality of modelling sessions of one or more users. Such a system would enable management of various users who are working on different aspects of a model toward the common goal of creating a final, evaluatable model.

The present invention relates to such a logical modelling system and method of modelling.

SUMMARY OF THE INVENTION

In accordance with the present invention, a computer based modelling system is provided. The system includes a computer processor, and means coupled to the computer processor for storing a model database. A set of primitives is stored in the database. Interface means are coupled to the computer processor for enabling a user to input, retrieve, and manipulate data within the database. Tooling means responsive to the interface means enables a high level user of the modelling system to create a modelling methodology by editing the database to define:

(a) modelling objects in terms of the primitives, (b) one or more modes of viewing the modelling objects, and (c) logical relationships between elements of said modelling objects and views thereof.

In a preferred embodiment, the interface means is a graphical interface.

The primitives stored in the database comprise entities, relationships for associating entities, and attributes for setting conditions on entities and relationships. The modelling objects can include entity structures, which comprise other entities, relationships, and/or entity structure types. At least one entity and one relationship is required to define an entity structure.

Modelling means, responsive to the interface means, enable a low level user to create models for specific applications. Such models are created by selecting views representative of modelling objects stored in the database, and manipulating the views in accordance with the modelling methodology. The views can comprise forms that are manipulated by entering information thereon, and/or graphic elements that are manipulated by being connected to forms or other graphic elements.

Management means, responsive to the interface means, enable the high level user to establish policies of coordination among a plurality of modelling sessions of one or more low level users. The high level user defines modelling objects, views thereof, and logical relationships between the objects and views representative of low level users, low level user tasks, and low level user results.

The model database has a recursive structure, whereby a change made to a first object contained in the database, or to a view derived from the database, will initiate corresponding changes in every other object or view logically related to the first object or view. The high level user can define additional attributes that are dynamic in nature for use in verifying the propriety of changes made to objects or views in the database. Verification means, coupled to the computer processor, are provided to test manipulations of views attempted by a low level user to verify their compliance with the modelling methodology. Means responsive to the verification means prohibits invalid manipulations.

Means are provided for evaluating a model created with the modelling means to determine its performance in an intended application for which the model was created.

A method is provided for creating modelling methodologies to enable a modeler to build evaluatable models for intended applications. In accordance with the method, a set of primitives is provided including entities, relationships for associating entities, and attributes for setting conditions on entities and relationships. The primitives are stored in a model database, and modelling objects are created from the stored entities, relationships and attributes. These modelling objects are stored in the database, and views thereof are created. Logical relationships between elements of the graphical views and modelling objects are defined and stored in the database. Through graphical views and the logical relationships, a user is provided with access to the modelling objects to enable models to be created for an intended application. Model creation is accomplished by manipulating views to edit entities and relationships in the modelling database in accordance with a methodology defined by the types of modelling objects provided, and the relationships and attributes applicable thereto.

In creating modelling objects, the method of the invention encompasses defining entity structures and storing them as modelling objects in the database. The method further contemplates the specification of rules, and associating such rules to modelling objects. Functions can also be defined and stored in the database. Other objects which can be defined and stored in the database include graphic objects, menu objects, queries, reports, forms, and help text. Policies of coordination can be established among a plurality of modelling sessions of one or more users.

The flow charts of FIGS. 9-14 are not intended to imply that any particular sequence of operation is required in the system of the present invention. Rather, these figures illustrate the various free choices that a system user will have during a tooling, managing, or modelling session. In a preferred embodiment, the various choices of action illustrated in the flow charts are provided on menus associated with different objects and their availability depends on what step the user is at during a session.

The designations LogicTool, ModelManage, and ModelView are trademarks of the assignee of the present invention.

DETAILED DESCRIPTION OF THE INVENTION

Figure 1:
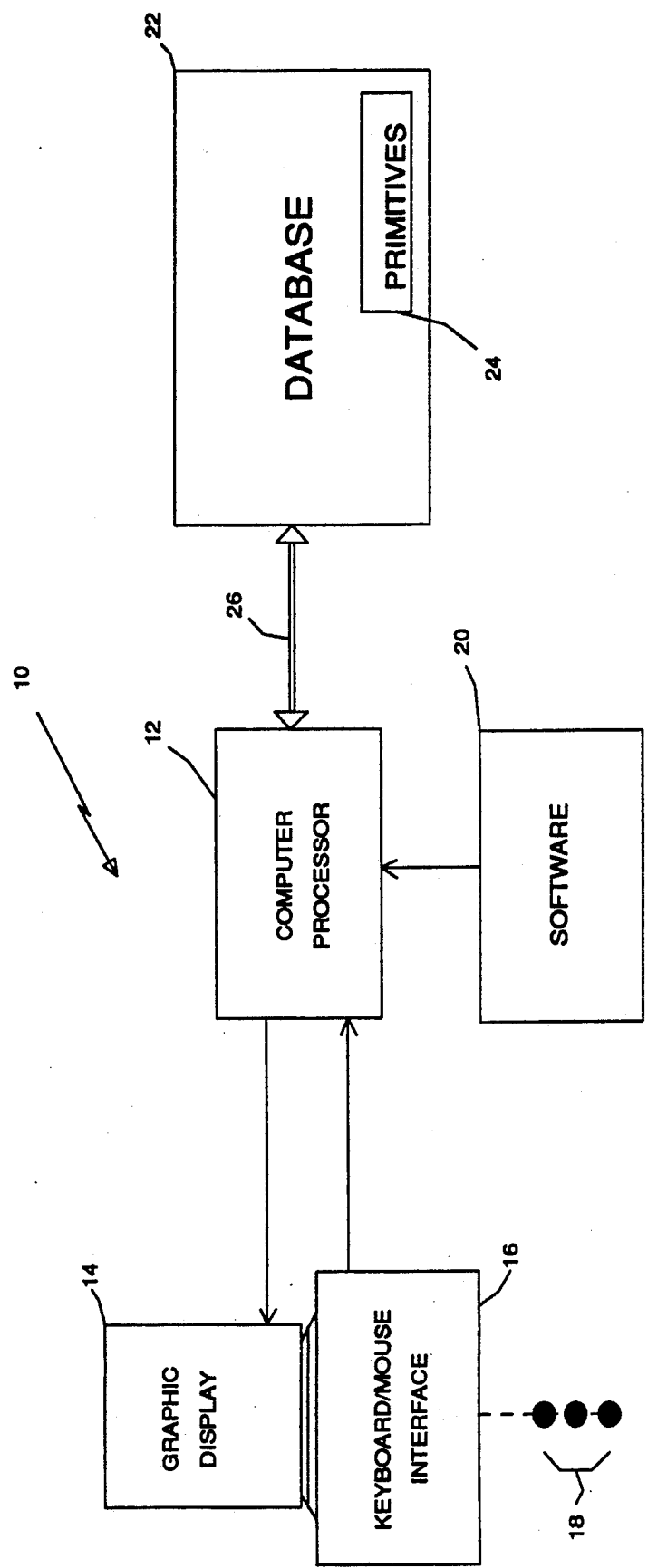
FIG. 1 is a block diagram of the modelling system of the present invention.

A block diagram of the modelling system 10 of the present invention is provided in FIG. 1. At the heart of the system is a computer processor 12 which can comprise a personal computer or the like, but is more typically part of a larger, network based system having a plurality of workstations 18, each including an interface 16 such as a keyboard and mouse together with a graphic display 14. Computer processor 12 is under the control of software, generally designated 20. The method and apparatus of the present invention is under the control of application software embodied in software 20. Software 20 will also include the operating system for computer processor 12 and other programs necessary for the operation of the system, such as network software (where the modelling system is used in a network environment). Computer processor 12 communicates with a database 22 via path 26 which is bi-directional. In other words, computer processor 12 can input and retrieve data to and from database 22. In accordance with the present invention, a set of primitives 24 is included within database 22 for use by a high level user, sometimes referred to as a "tooler", to create a modelling methodology.

Figure 2:
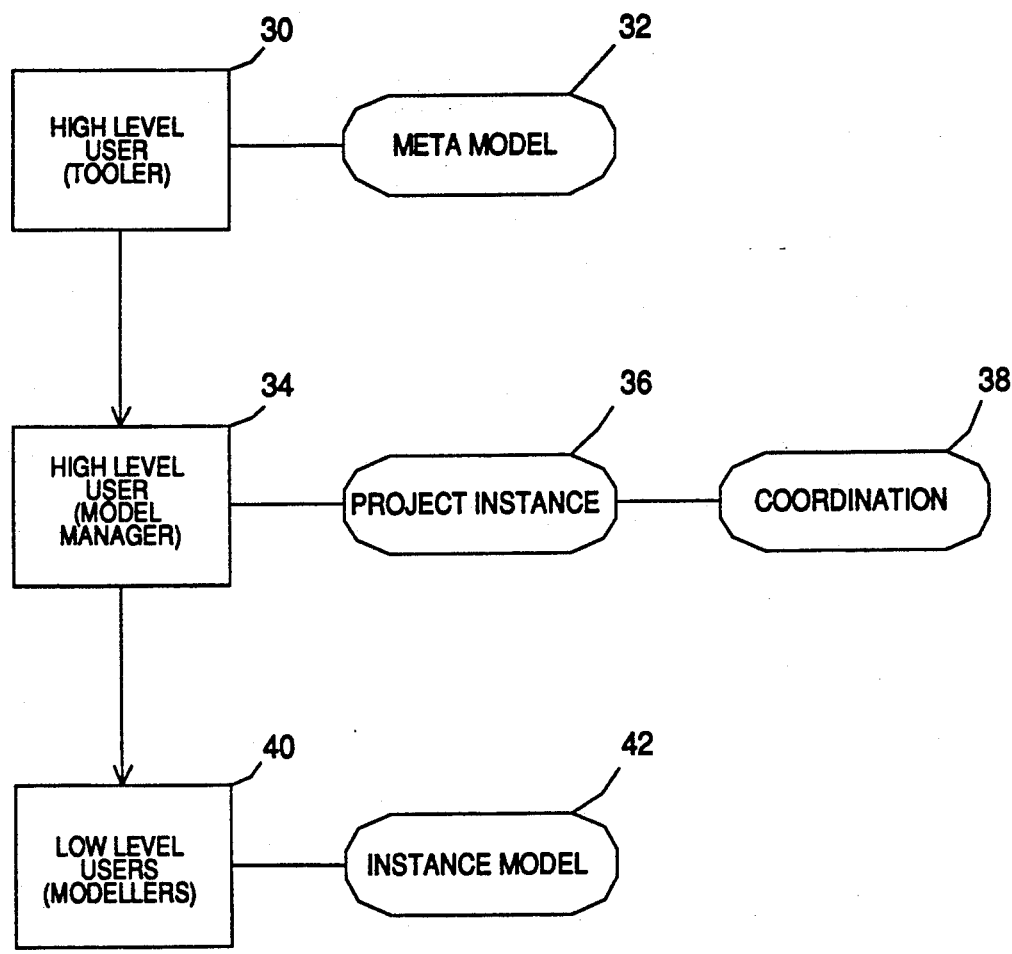
FIG. 2 is a block diagram illustrating the tasks of various users of the modelling system of the present invention.

FIG. 2 illustrates the various levels of user that can interact with the system of the present invention. A high level user 30, in the role of a tooler, develops a meta model 32 that defines the entity-relationship model of a design discipline. To create the meta model, the tooler uses a software tool referred to as the "LogicTool" program. Through the LogicTool program, the tooler defines modelling objects in terms of the primitives 24 in database 22, modes for viewing the modelling objects, and logical relationships between elements of the modelling objects and views thereof. For purposes of this disclosure, the term "modelling object" will be understood to include models and portions of models as well as the entities, relationships, attributes and roles that are used by a tooler to define a modelling methodology. Form and diagramming interfaces are also defined by the tooler, and provide tools that a subsequent lower level user can use to create a model instance. The LogicTool program itself uses diagrams and forms to define the model structure and interfaces. After defining the modelling objects, viewing modes, and logical relationships therebetween, the tooler compiles this information into a usable meta model 32.

In another role, the high level user functions as a "model manager" as indicated at 34. The model manager defines a specific project or projects to be worked on by lower level users. Each project instance 36 defines the scope of a model to be created by the lower level users. The model manager can also provide coordination 38 to manage the completion of projects by system users, through the establishment of policies of coordination among a plurality of modelling sessions of one or more users.

The low level users 40, referred to as "modelers", are the persons who actually create an instance model 42. The modelers are constrained in their use of the system by the modelling methodology defined by the tooler, and embodied in meta model 32.

Figure 3:
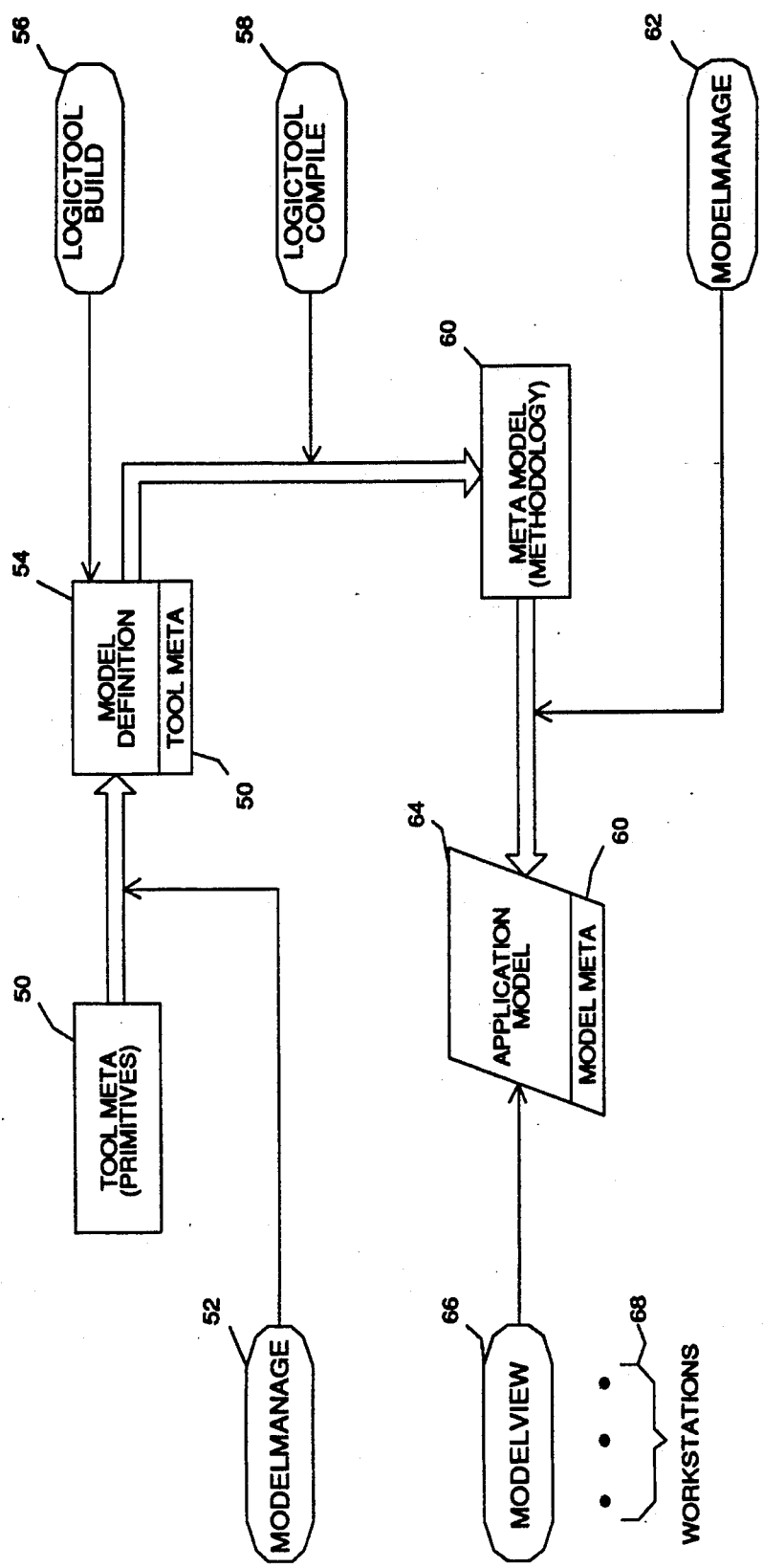
FIG. 3 is a block diagram illustrating how the system of the present invention is used by the different users thereof.

The creation of a modelling methodology and model is shown in more detail in the block diagram of FIG. 3. The system of the present invention is provided with a tool meta 50 that includes the primitives used by the tooler to define the modelling methodology. The LogicTool program is used to build a model definition 54 using the primitives from tool meta 50 as indicated at 56. The tool meta is instantiated through the ModelManage program as indicated at 52. After the model definition 54 is complete, the LogicTool program is used to compile the definition as indicated at 58. The result is the meta model 60 which embodies the modelling methodology designed by the tooler.

The ModelManage program is then invoked at 62 to enable a modeler to create an application model or "instance model" 64 using a "ModelView" program 66. As noted above, the ModelManage program enables the model manager to define a project instance to be worked on by the modelers and coordinates the activity of the modelers. A plurality of modeler workstations 68 are provided to enable work on the project instance to be allocated among a number of different modelers.

Thus, as is clear from FIGS. 2 and 3, system primitives are used to define objects, which in turn are used to create models. The tooler defines ways of viewing the models, wherein changes to views of the models result in changes in the database representing the model.

Those skilled in the art will appreciate from a study of FIGS. 1-3 that the present invention differs from prior art CAD/CAM and information systems by utilizing an underlying database technology to manage a model and to enforce logical rules in the model (i.e., the integrity of the model). In order to implement a logical modelling system of this nature, the interface between the user and the modelling system must involve both common database techniques such as forms, queries, and reports together with additional diagramming techniques to create objects and relationships. Then, the model must be stored and managed in a database. Existing database management systems do not readily support graphical interfaces at the front-end thereof. The present invention, however, supports a powerful graphical interface at the front-end to enable the various levels of users to input, retrieve, and manipulate data within the database, as described in greater detail below. It should therefore be appreciated that the present invention provides a database management system specialized for logical modelling, in which graphical interfaces and their mappings to a logical database are defined by the system users. The graphical interface is used to directly define the database structure, which together with the forms, diagrams and graphics used to interface to the database structure form the meta model.

Logical modelling is concerned with describing entities and their relationships to other entities. Therefore, the present invention uses an entity-relationship database managed by an ERA (entity-relationship-attribute) database management system. In such a database, an entity is composed of a group of attribute values and may be in various relationships with other entities, each having its own attribute values. The relationship itself may also have attribute values. The ERA database management system ("DBMS") of the present invention may be implemented on top of a lower level, commercial hierarchical DBMS such as db_Vista, to which additional functionality is added to implement effective ERA models. In accordance with the present invention, the ERA database management system is designed to support relationships of any number of objects in a single relationship instance ("N-ary relationships"). Such a relationship is illustrated in FIG. 4.

Figure 4:
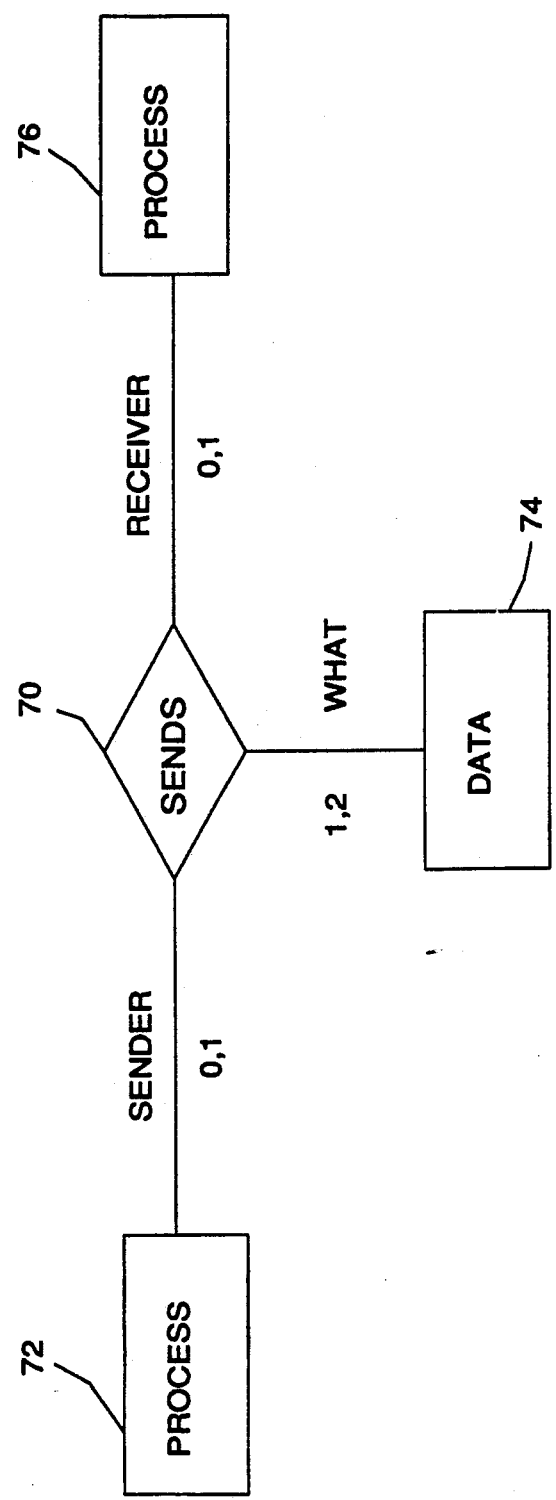
FIG. 4 is an entity relationship diagram showing an example of a "sends" relationship that can be provided in a modelling methodology in accordance with the present invention.

In the entity relationship diagram of FIG. 4, a process 72 sends data to another process 76. A sends relationship 70 involves three entities; namely, the sender, the receiver, and the data sent as indicated at 74 (i.e., the "what"). In the hypothetical entity relationship diagram model of FIG. 4, the "meta-roles" in the "meta-relationship" are that a "sends" relationship 70 has either one sender or no sender (assuming there is a receiver), one receiver or no receiver (assuming there is a sender), and one data or two data. Thus, in the defined relationship, one process can send one data to one process, or one process can send two different data to one process. As described below, an attempt to invoke the relationship of FIG. 4 in a manner not defined by the relationship is invalid and will be prohibited by the system.

An entity-relationship model provided by the present invention allows information to be viewed about objects and relationships between the objects in a clear and concise manner. The model consists of entities, relationships, and roles that entities or relationships play in relationships. It is important to note that entities in relationships can also have attributes. The entities are anything that can be identified. For example, a process in a data flow diagram is an entity, and the meta model determines what the entity actually is and how it is used in relationships in a design. Entities in the meta model can be "subtypes" of other meta entities, such that the entity inherits all attribute definitions from its supertype and also inherits any future changes in the supertype. A subtype can also have additional attributes associated with it. Due to the dynamic nature of the database of the present invention, when a supertype is deleted, its subtypes are also deleted.

A relationship is an association among entities and perhaps other relationships. The sends relationship 70 in FIG. 4 is a relationship between the two process entities 72, 76. Those skilled in the art will appreciate that when an entity is referred to as being "in a relationship", it is understood that the entity could just as well be a relationship. Thus, it is possible to have a relationship which is playing a role in another relationship. As with entities, a relationship's type and what it consists of are expressed in the meta model of the database.

Entities play roles in relationships. Thus, process 72 at the beginning of sends relationship 70 is playing the role of the "sender" of data to the process 76. At the same time, process 76 plays the role of the "receiver" of the data. The data 74 is playing the role of "what" is being sent. The meta model includes information that describes a valid combination of role players in an instance of a relationship. Such combinations are referred to as "player sets", and there can be one or more player sets for a relationship in the meta model. Each player set consists of role-player combinations, where the role specified must be played by the corresponding entity or relationship types when the relationship is created or modified. Consistent with the proper logical operation of the present system, each role in a relationship in the meta model must be accounted for. Therefore, the database will not allow a relationship to exist which does not fit into one of the player sets.

The process by which the system of the present invention validates relationships is illustrated in FIGS. 5a, 5b, 6a, 6b, 7a, and 7b. Each of these figures relates back to the relationship illustrated in FIG. 4.

Figure 5A:
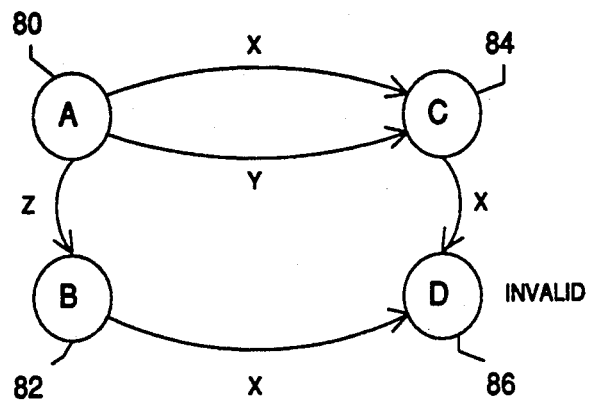
FIGS. 5a and 5b illustrate an attempted use of the relationship of FIG. 4 and the verification thereof.

In FIG. 5a, instances 80, 82, and 84 of the sends relationship 70 are valid. Instance 86 is invalid because by the definition of the sends relationship 70 in FIG. 4, it is illegal for the process "D" to receive data "X" from two different senders, namely "B" and "C". This conclusion is arrived at in the modelling system by holding the "receiver" and "what" roles constant and seeing that there can only be one "sender".

Figure 5B:
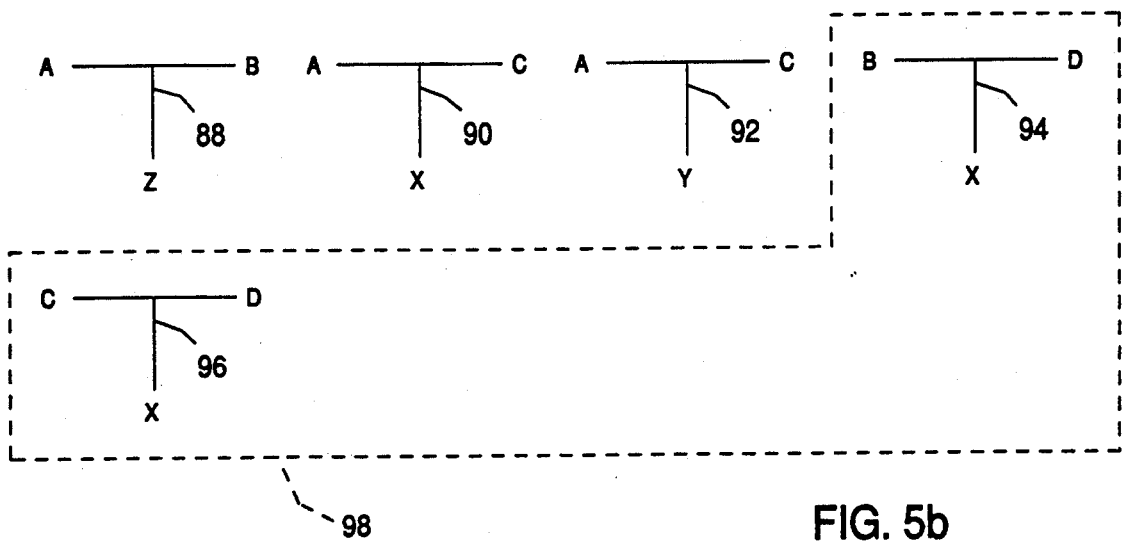

This analysis is set forth in FIG. 5b. In FIG. 5b, every sends relationship from FIG. 5a is represented by a stick diagram 88, 90, 92, 94, and 96. The analysis proceeds by holding two roles constant and looking for variances in the third. If the "what" and "receiver" roles are held constant, each instance of a particular data being sent to a particular process would be checked for adherence to the constraint that there can only be from zero to one sender. Thus, data "Z" being sent to "B" by "A" in stick diagram 88 is valid since one process can send one data to one process. Similarly, data "X" and "Y" sent to "C" by "A" in stick diagrams 90 and 92 is valid since one process can send either one or two different data to one process. The sending of data "X" to "D" by "B" is valid since one process can send one data to one process. However, sending data "X" to "D" by "C" is invalid since two different processes cannot send the same data to one process. The invalid situation is indicated by box 98 in FIG. 5b.

Figure 6A:
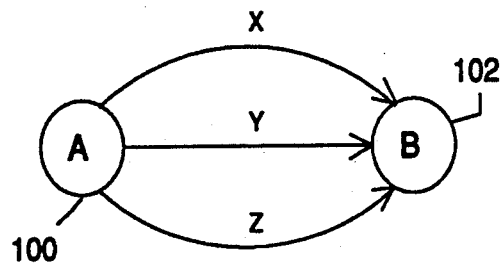
FIGS. 6a and 6b illustrate another attempted use of the relationship of FIG. 4 and the verification thereof.
Figure 6B:
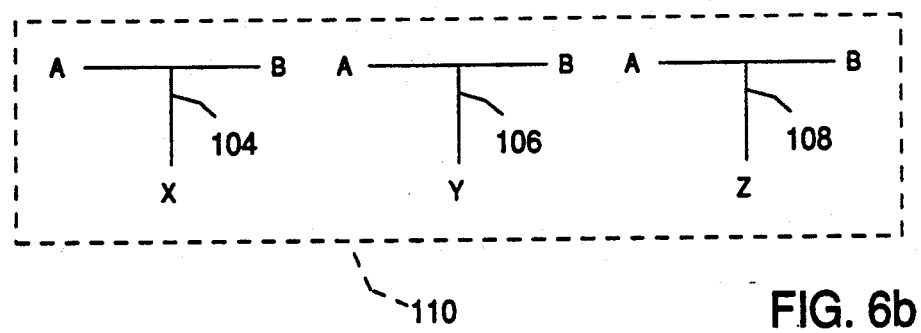

A similar analysis is made in FIGS. 6a and 6B, where sender 100 sends three different data to process 102. The relationship defined in FIG. 4 allows a maximum of two data to be sent to process 76, which is analogous to process 102 in FIG. 6a. The attempt to send three different data from process 100 to process 102 is invalid, as indicated by stick diagrams 104, 106, and 108 enclosed by box 110 in FIG. 6b.

Figure 7A:
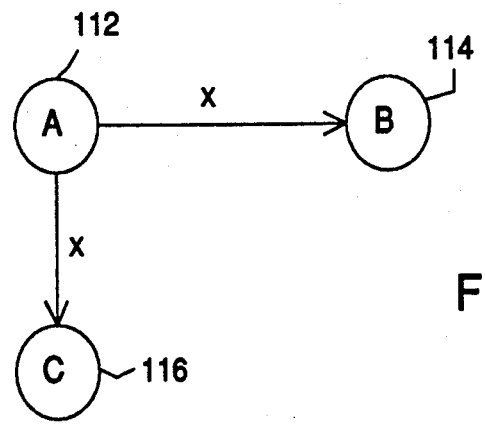
FIGS. 7a and 7b illustrate another attempted use of the relationship of FIG. 4 and the verification thereof.
Figure 7B:
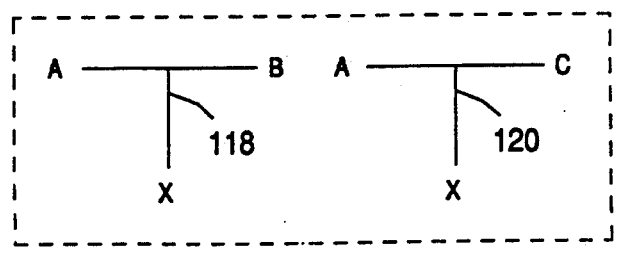

In FIG. 7a, data "X" is sent by process 112 to each of processes 114 and 116. This is invalid, because by the definition of the sends relationship in FIG. 4, it is illegal for one data to be sent by one process to two different processes. If the "sender" and "what" roles are held constant, each particular process sending data would be checked for adherence to the constraint that there can only be from zero to one processes receiving the data. Since this constraint is not met in FIG. 7a, as indicated by the two stick diagrams 118, 120, the attempt is invalid as indicated at box 122.

In the manner illustrated in FIGS. 5-7, the system of the present invention is able to verify, using logical techniques, whether manipulations (e.g., connections) of views attempted by a modeler comply with the modelling methodology established by the system tooler. Attempts at invalid manipulations are prohibited.

Those skilled in the art will appreciate that the sends relationship illustrated in FIG. 4 is merely one example of a relationship. A virtually unlimited number of other relationships can be implemented in accordance with the present invention in a similar manner.

Figure 8:
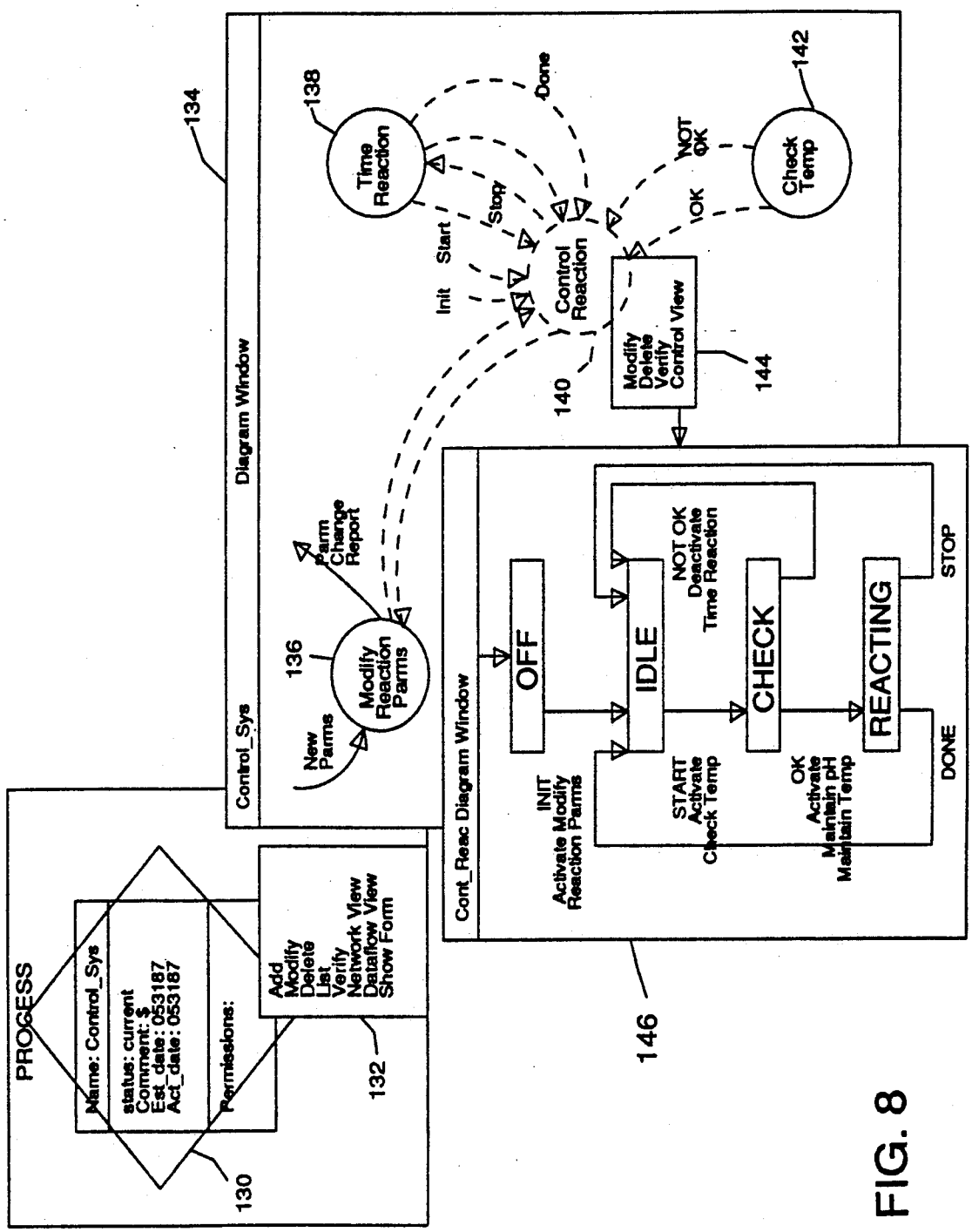
FIG. 8 is a diagrammatic view of a modelling object, a graphical view thereof, and a control flow diagram relating thereto.

An example of the interface which a modeler has to the system of the present invention is illustrated in FIG. 8, which shows a diagrammatic view of a process type entity structure represented by symbol 130. The diagram of FIG. 8 is an example of what a modeler might see on the screen of his or her graphic display 14 (FIG. 1) when creating a model. Menu 132 associated with entity structure 130 simply provides the modeler a choice of operations that can be performed with regard to the entity structure. View 134 is a data flow diagram of the entity structure 130. This entity structure is a particular process, and graphical objects 136, 138, 140, and 142 depict various aspects of the process. By choosing the option "control view" on menu 144, which is placed over graphical object 140, the modeler can obtain a process diagram 146 of the process control reaction represented by graphical object 140. As will be appreciated from FIG. 8, the graphical interface used in connection with the system of the present invention is extremely powerful, and enables the modeler to view the database from many perspectives. Techniques for providing such graphics are disclosed in commonly assigned prior U.S. Pat. Nos. 4,656,603 and 4,813,013 referenced above. Other systems for generating such graphics are well known in the art.

Figure 9:
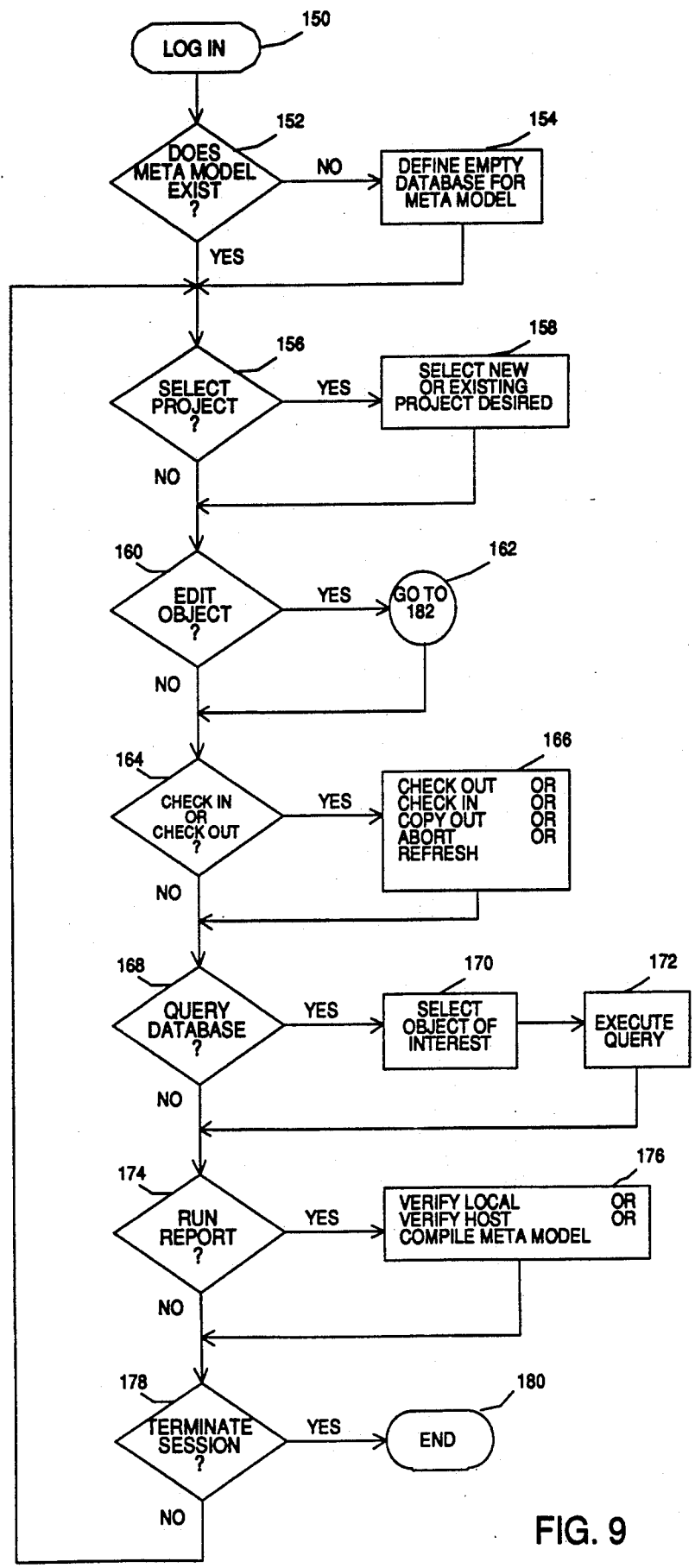
FIG. 9 is a flow chart of the "LogicTool" portion of the modelling system that enables a high level user to create a modelling methodology.
Figure 10A:
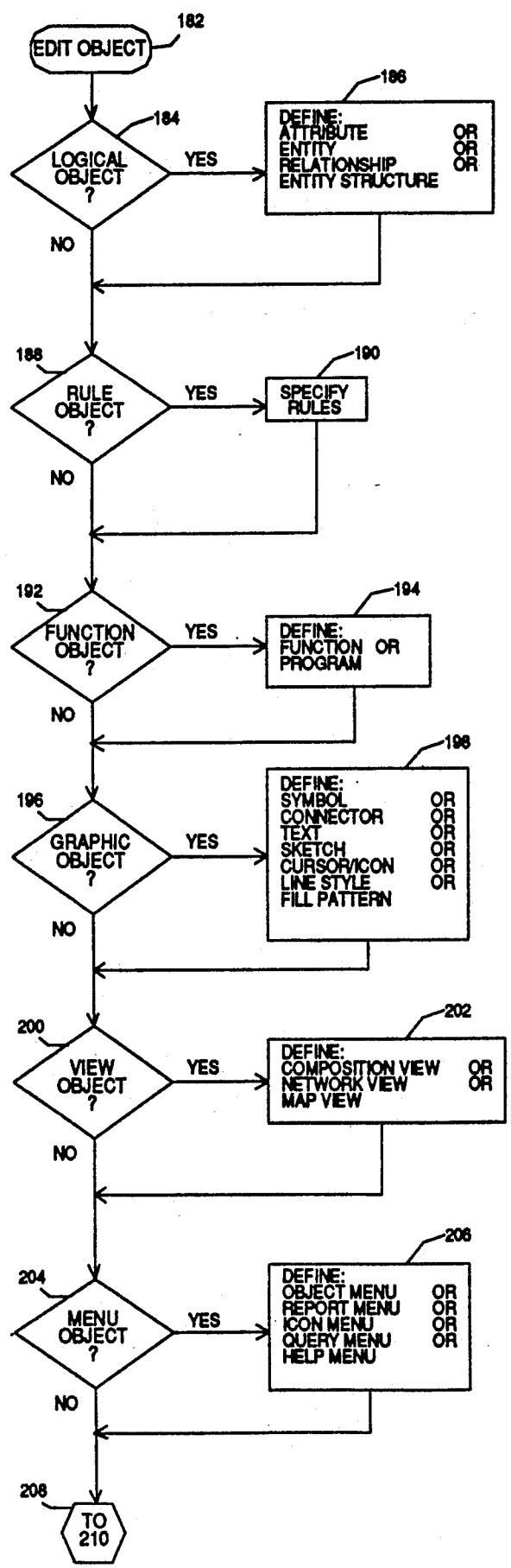
FIGS. 10a and 10b are a flow chart illustrating the "edit object" step of the flow chart of FIG. 9 in greater detail.
Figure 10B:
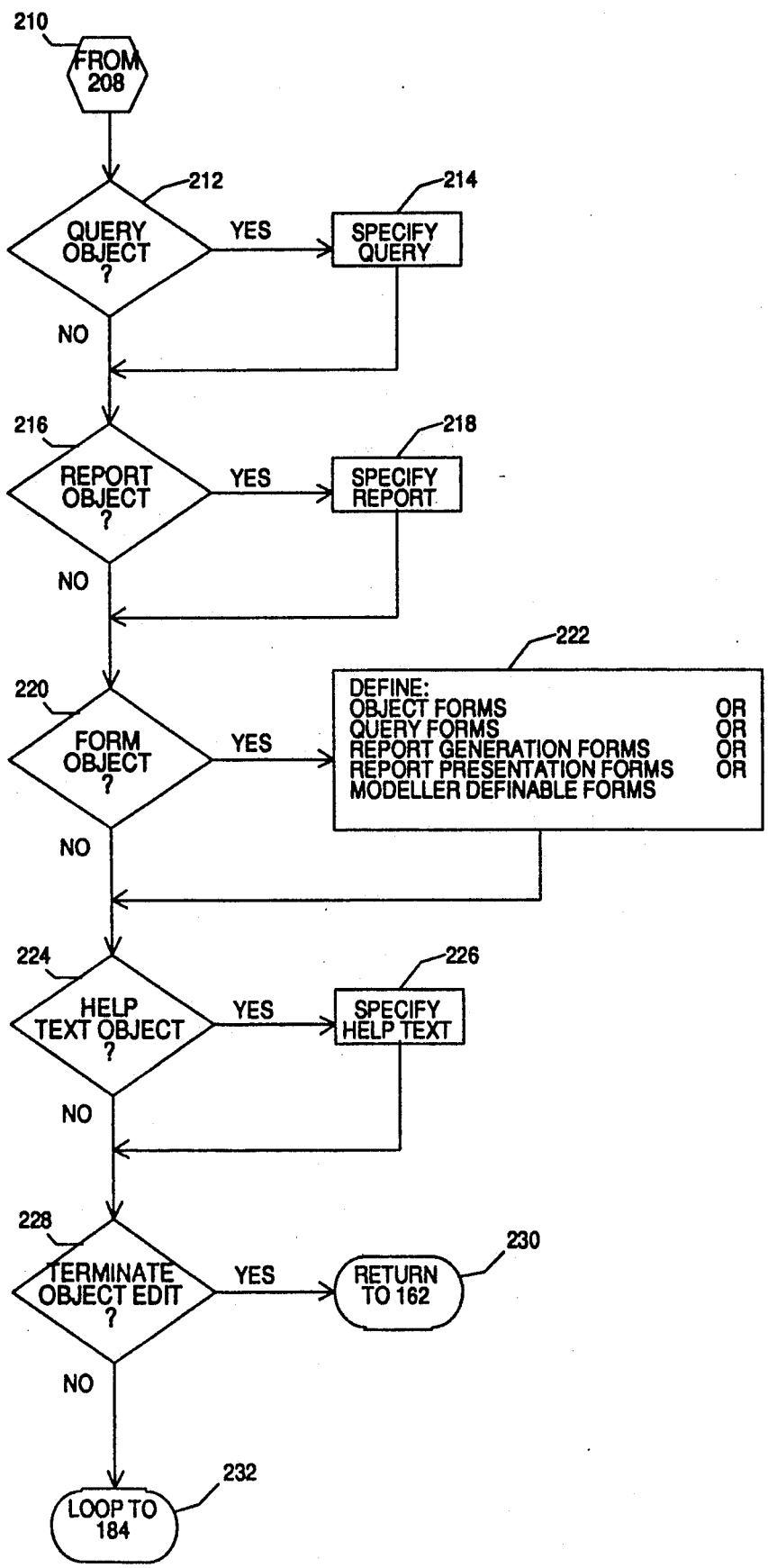

The overall operation of the LogicTool program, which enables a tooler to create a modelling methodology, is illustrated in the flow charts of FIGS. 9, 10a, and 10b. These flow charts are not meant to indicate a predefined operational flow of the system. Instead, they are merely indicative of various free choices that will be provided to a system user. Typically, these choices will appear on menus associated with objects displayed on a user's workstation.

Turning to FIG. 9, a tooler logs into the LogicTool program at 150. LogicTool is used to create the meta model by defining entity, relationship, and entity structure types. LogicTool is also used to define how objects in the meta model can be graphically viewed. The logical database is viewed through the graphics (including forms) defined by the tooler. The graphic objects in a view can subsequently be used by a modeler to create or modify logical object instances by manipulating the graphic objects.

Through LogicTool, the tooler can define both graphic symbols and forms to represent entities, relationships and entity structures. Forms are an alternative to the object symbol interface, and can also be defined for reports and queries.

After logging into the LogicTool program, the tooler may be queried as to whether the meta model he wishes to work on already exists, as indicated at box 152 of FIG. 9. If not, as indicated at box 154, the tooler defines an empty database for the new meta model. Then, at box 156, a determination is made as to whether the project for which the tooler wishes to create a methodology needs to be selected. If so, the tooler selects a new project or an existing project to work on, as indicated at box 158.

After identifying the project that is to be worked on, the tooler is given the choice of editing an object in the meta model at box 160. If the tooler wishes to edit an object, the edit object routine of FIGS. 10a and 10b is entered at box 162. This routine will be discussed in greater detail below.

If, at box 160, the tooler does not indicate he wishes to edit an object, the tooler might "check in" or "check out" an object from the meta model as indicated at box 164. The term check out is used to designate the act of retrieving an object from the database to be worked on. The term check in designates the return of an object, that was previously checked out, to the database. If the tooler wishes to check in or check out an object, the desired operation can be accomplished at box 166. As indicated in box 166, the tooler will have the option to check out an object, to check in an object, to copy out an object, to abort a checkout operation, or to refresh an object already checked out by updating it to incorporate any changes made to the object since the time of checkout. The term "copy out" is used when the tooler desires to get a read-only version of an object from the database, without actually checking the object out to be worked on. When "abort" is selected, the checkout status of an object is aborted and any modifications made on the object since the checkout are nullified.

As indicated at box 168 in FIG. 9, a tooler may wish to query the database. This function can be used to query pieces of the meta model, and is useful to find objects and to interrogate relationships between objects. Upon an indication that the tooler wishes to query the database, the tooler selects the object of interest at box 170. Such objects can be either logical, rule, function, graphic, view, menu, query, report, form, or help text objects. Each of these types of objects is described in greater detail below, in connection with the edit object routine of FIGS. 10a and 10b.

Once the object of interest is selected at box 170, the query is executed at box 172. An example of how a tooler might use the query database function is to find out which views in the meta model use defined icon menus. To accomplish this, the tooler would create a query on the logical relationship "contains", and then select the view and icon menu entities as the container and containee, respectively, of the relationship. A wild card would be entered for the names of both entities, and the modelling system would execute a search for all items that satisfy the query. Each entity that matches the query would then be listed.

The next function available to the tooler is the run report function designated at box 174. This function enables the tooler to verify the model which has been created. In a preferred embodiment of the present invention, three options are provided. The first is the "verify local" option used to verify the local database at the tooler's workstation. The second option is the "verify host" option used to verify the centralized database in the modelling system. Both options will check all of the objects in the model for consistency and completeness. Any errors will be displayed for further action by the tooler. The third option that the tooler can select in the run report function, as indicated at box 176, is the "compile meta model" option. This option is used, as discussed above in connection with box 58 of FIG. 3, to compile the completed model defined by the tooler into a final meta model which can then be used by a modeler to create model instances.

Once the tooler compiles the meta model, or exits the run report function for any other reason, an opportunity is provided to terminate the tooling session If the tooler wishes to terminate the session, the LogicTool program is ended at box 180. Otherwise, the tooler can choose to complete further work within the LogicTool program.

Turning now to FIGS. 10a and 10b, the process of editing an object within the LogicTool program is described. As noted in connection with FIG. 9, the tooler is given the opportunity to edit objects at box 160, and if he chooses to do so, as indicated at box 162 of FIG. 9, the edit object routine is entered at box 182 of FIG. 10a. A tooler is given the choice to create a logical object, at box 184. If this is the tooler's intent, the tooler is given an opportunity to define an attribute, or an entity, or a relationship, or an entity structure at box 186.

Entities and relationships can have attributes. The type of attributes each entity and relationship can have, and how many can be applied to each, is specified by the tooler in designing the meta model of the database. The ERA database provided in the modelling system of the present invention supports various primitive attribute types and groupings as previously mentioned in connection with element 24 of FIG. 1 and element 50 of FIG. 3. These primitives include attributes such as "character", "integer", "fixed decimal", "floating point decimal", "array", "string", "text", "enumeration", and "structure". An array may include characters and/or integers, which may be defined as fixed or floating. A string is generally a character string, and text is a variable length string. An enumeration is a set of integer values which can be referenced by character strings, such that each unique string maps to an integer. A structure is a collection of attribute types, each of which can be different. An example of a structure is an address, wherein the attribute types include a first name, a last name, and the street, city, and state which together comprise the address. Those skilled in the art will appreciate that certain attribute types such as character, integer, fixed decimal, floating point decimal, and strings can be used as keys to allow for more efficient searching within a model.

The attributes described above are primitive attributes. An important feature of the present invention is the provision of dynamic attributes, referred to as "triggers" and "evaluators". These dynamic attributes give rise to the dynamic nature of models created using the system of the present invention.

Dynamic attributes can be written by a tooler using the Prolog "programming in logic" language, or another equivalent first order predicate logic language. When an object containing a dynamic attribute is used in a model, the program defining the attribute is executed.

Triggers are dynamic attributes that can be of any one of three types; namely, deletion triggers, verification triggers, and constraint triggers. Deletion triggers are executed when an instance of an object is to be deleted. The result of its execution is true if the deletion can be performed successfully, and false if the deletion cannot be performed. The database performs the delete depending upon the outcome of the deletion trigger.

Constraint triggers are executed whenever an object is modified. They check to ensure that any modification to an object meets the constraints that are implicit in the object's definition. Like deletion triggers, constraint triggers return a true or false. If a false is returned, the changes to the object cannot be committed. Thus, if the value of an attribute depends upon the value of another, and that value is modified, a constraint trigger would be run to ensure that this dependency is not violated.

Verification triggers are used when an explicit check of an object is needed. Thus, these triggers are application-defined rules on an object, and are run when an object's function is being verified within a meta model.

Evaluation attributes are additional dynamic attributes used to evaluate a model instance created by a modeler. Evaluators operate in much the same way as triggers, and can be written in Prolog or equivalent logics. They are executed upon evaluation of the model instance.

The power of Prolog programs which can written, and thus the dynamic attributes, depends on built-in functions provided by the modelling system. Such functions are provided to access and update the database, to access and update graphics, and to work with forms, menus and windows. Additional built-in functions are provided to execute an executable program, and to execute an ASCII Prolog program. The ability to invoke other programs through these built-in functions provides a mechanism to link the front end of the modelling system with back-end programs. Thus, the tooler is able to define objects which can contain an attribute that is a Prolog program. Once the tooler defines such objects, a modeler can create instances of the object type and write Prolog programs for the object using an application programming interface. Programs written by a modeler are run via a function provided by the tooler in the modelling methodology. As a convenience, the system of the present invention also provides a Prolog debugger to facilitate the writing and debugging of programs by the tooler, model manager, and modeler.

Modelers can utilize the application programming interface to establish conditions on a model. These are then used to establish the validity of the model for its intent and purposes. The modeler obtains a view of a model or object, and uses a Prolog or equivalent program to define constraints or stimuli on the model or object. In the hands of the modeler, the use of such programming capabilities is on an ad hoc basis with respect to a model, unlike the use of dynamic attributes by a tooler who defines constraints or stimuli with respect to a methodology.

In addition to defining attributes, as indicated at box 186 of FIG. 10a, the tooler can also define entities, relationships, and entity structures. Using the graphic interface, entities are given names and graphical structures. The creation of graphic icons to represent different entities is described in more detail below with reference to the diagramming flow chart of FIG. 13. When defining entities, the tooler can insert a new entity, alter definitions of existing entities, delete entities, and list existing entities. When an entity is created or modified, entity attributes are defined, rules to be triggered when the entity is added, deleted, modified or verified in the database are specified, and functions (e.g., using Prolog programs) can be defined which relate to the entities. Further, a tooler can define a form interface to an entity.

Relationships are defined by the tooler for logical objects in a similar manner. Any number of entities can take part in a relationship defined by the tooler. Each entity which takes part in the relationship is said to "play a role" in the relationship. Each relationship is defined with a fixed set of roles. The types of players, however, may vary.

Relationships can also have attributes associated with them. Thus, a relationship is specified by a tooler by putting together different pieces such as entities, attributes, roles, entity structures, and other relationships. Like entities, relationships are displayed graphically, and the tooler uses the diagramming capabilities of the system to define the graphical representations of relationships. Certain graphic primitives are provided in the system for use in building relationships. For example, entities, relationships, entity structures, and attributes may each be represented by predefined primitive icons accessible to the tooler. Similarly, icons can be provided for predefined relationships (used to define relationships in another relationship), role connectors, sketches, rules, functions, and forms. To define a relationship using the graphic primitives, the tooler places instances of the icons in a drawing space on his graphic workstation. Then, fields provided in the icons are filled in with required information. Role connectors can be used to connect an object icon to the relationship symbol and thereby specify the role of the object in the relationship. The sketch icon can be used to associate sketches with logical objects in a relationship. Similarly, attribute icons are used to associate attributes with the relationship. Rule icons are used to define rules or constraints, which are checked when the relationship is added, deleted, modified, or verified. The modification of default functions, and adding of new functions can be accomplished using function icons. The form icon is used to define a form interface for a relationship.

The definition of entity structures is similar to the definition of entities, described above, except that entity structures can have graphical end user views associated with them. In defining a view, the tooler specifies how to map graphical actions to corresponding actions in the logical model. Diagramming of entity structures is generally the same as diagramming attributes, entities, and relationships as discussed above. Primitive graphic icons similar to those discussed in connection with defining relationships are also provided for use in defining entity structures. In addition, entity icons are provided for use in defining entities to be contained in the structure. A reference relationship icon is also provided to define the relationships between entities or entity structures that are not owned by the entity structure. Such relationships are not deleted when the entity structure instance is deleted. A view icon is provided for use by the tooler in constructing the view definition of the entity structure. A view definition is used to create the diagram fragments which tell the system how to map from graphical action to logical action.

When the tooler has completed defining the logical object or objects necessary for the modelling methodology, the tooler might decide, at box 188 of FIG. 10a, to create rule objects for use in specifying rules to be checked when an entity is added, deleted, modified or verified in the database. The rules are associated to the objects during the definition of the object. Such rules may encompass constraints on values of attributes, and minimum/maximum occurrences of players of roles and members of entity structures. Such constraints are static, such that they are always the same no matter what the instances are like. Dynamic constraints are also possible with the present system. A dynamic rule may take the form "if A is true, then B must be implemented". In general, rules or constraints are defined using Prolog programs which return true or false when they are activated, indicating whether the rule was adhered to or not. Thus, prior to deleting an object, the delete rule is triggered. If a false is returned, the object will not be deleted from the database.

Rules may be added or modified by a tooler, deleted, verified, and associated with or removed from entity structures. After the specification of rules as provided at box 190, a tooler can choose to define functions or programs, as indicated at boxes 192 and 194.

Function objects are defined by a tooler to add new functions to the ModelView interface (used for diagramming) or to modify or delete default functions from the interface. These functions are associated with object types, and are applicable to both the object symbols and forms in the ModelView interface. A tooler may also define new functions, or modify or remove default functions on graphic objects.

Programs can be defined by a tooler in Prolog, and run against the entire local or centralized database. The programs are written using predefined built-in functions provided in the modelling system. Examples of such built-in functions are those that display a data entry screen, interrogate and update the database, and do some simple report formatting. As noted above, an important built-in function is the ability to execute another program. Upon defining functions and programs, the tooler is given an opportunity to define graphic objects as indicated at box 196. As indicated at box 198, the tooler can define symbols, or connectors, or text, or sketches, or set cursors and icons, or define line styles, or define fill patterns. Such graphics are instrumental as interfaces into the logical model. Therefore, the tooler must define the symbols and connectors which will be used for the graphic interface.

Once defined, these graphic objects are used in the definition of views of entity structures and networks which tie the graphic objects to their logical counterparts. The graphic objects are also used in building icon menus, which are a collection of graphic objects that can be used within the system. Obviously, since the graphic objects are used in views and icon menus, they must be defined by the tooler prior to defining the views and icon menus. Graphic objects may be either symbols and connectors (composed of special symbols or graphic primitives such as lines and arcs) or they may be text. Custom functions on graphic objects may also be defined by the tooler.

Graphic symbols are defined using the diagramming capabilities of the system, which will typically provide lines, circular arcs, elliptical arcs, circles, graphic text, an icon box, and a function icon. The icon box is used to define the icon form of the symbol or connector. The function icon is used to nullify or redefine a default graphic operation, or add a new operation on the graphic symbol.

Graphic connectors are similarly defined by the tooler. In addition to the basic icons listed for use in defining graphic symbols, icons representing an end point menu and default arrows are provided for use in defining graphic connectors. The end point menu symbols are used to impart directionality and define the end point geometry to connectors. Default arrows are symbols used for connector directionality and end point definition. Typically, three such symbols are provided; namely, an open arrow, a closed unfilled arrow, and a closed filled arrow.

Text is used to label symbols and connectors, and is composed of unalterable and alterable fields. Unalterable fields are normally used to label the alterable fields, which will eventually be associated to entity names and attributes in the logical model.

Sketches are diagrams whose components have no relation to the logical objects in the database. A sketch is stored in the database as a single object, and logical objects can be associated with sketch objects in a relationship. A sketch may be a simple drawing used for presentations, that is not part of the modelling diagram itself.

Cursors and icons can be defined by the tooler using an interface provided in the system to an icon editor. The cursor is associated with mouse actions within a window on the system user's graphic display. The icon is the graphic image that represents a closed window. In the LogicTool program, a tooler can associate cursors and icons with windows and menus if it is desired to customize the system. The system will be provided with standard cursors and icons which can alternately be used.

In a similar manner, the tooler can define custom line styles (e.g., solid, dashed, double dashed, and the like) for use in addition to the standard set of line styles provided with the system. The line styles are created using graphic primitives provided with the modelling system.

Finally, in defining a graphic object the tooler can define fill patterns which are used to fill in graphic symbols or connectors. When the tooler has completed defining one or more graphic objects, the tooler has an opportunity to define views, as indicated at box 200 in FIG. 10a. The view definition is where the graphic objects created by the tooler are tied to the logical model. A tooler can define multiple ways to view something in the database. Thus, a model may concurrently be seen in different ways (i.e., from different views). As an example, if a building is being modelled, the tooler can provide the capability for the modeler to view the plumbing, or the electrical wiring, or the floor plan, or the heating system, etc., all as separate views available to the modeler at the same time.

The modeler uses the graphic objects provided by the tooler to create and manipulate entities, relationships and entity structures. The association of the graphic objects to the logical model is established through a technique called diagramming fragments. A diagramming fragment is a small piece of a diagram representing a certain graphical action by the modeler. The fragment describes how to map this graphical action to the corresponding logical action.

For example, in the relationship of FIG. 4, connecting process bubble 72 and process bubble 76 to sends bubble 70 creates a sends relationship between the two processes, with the data sent indicated by the "what" label on the connector from data bubble 74. These fragments are graphical, and the diagram of FIG. 4 defines the view. This diagram contains all the fragments which can be used in the view. In creating a model, all graphical actions that the modeler performs in the view must be defined with a diagram fragment. Thus, if the modeler were to attempt to connect two symbols with a particular connector, but there was no fragment corresponding to the three graphical objects (two symbols plus connector), the connection would not be allowed, and an error message would be displayed. As explained in greater detail below, a model instance is created by the modeler choosing graphic objects provided by the tooler and creating diagrams therefrom. These diagrams, or "views", are analyzed by the system, as the modeler builds the model, to try to match the diagramming fragments used by the modeler to fragments (and thereby relationships) previously defined by the tooler in the database.

There are two kinds of views that the tooler can define. These are "compositional views" that correspond to the composition of entity structures (compositional views create the necessary mapping between the graphical views and entity structures), and "network views" which are diagrams that show the interrelationships of the objects in the database. Both are indicated at box 202 of FIG. 10a.

The creation of compositional views by a tooler is a fundamental element of the present invention. By using various diagramming fragments provided in the system, the mapping between logical definitions created by the tooler and stored in the database, and views subsequently derived from the database and manipulated by a modeler is achieved. Thus, the diagramming fragments provide the mechanism by which graphical views (including forms) are tied to the logical structure of entity structures in the database. The mapping is completed by the system when it compiles the meta model defined by the tooler, and generates fragment definitions for each relationship created by the tooler.

A modeler may use one or more types of fragments to create a view. Such views can be perceived as a language, which the system parses into entity structures as the view is being created by the modeler. As each fragment is placed on the workstation screen by the modeler, the system tries to match the resulting view with a relationship previously defined by the tooler and stored in the database. Upon finding a match, the system recognizes the view being created by the modeler as including the matched relationship, and builds the database according to specific information entered by the modeler with respect to the relationship. It is important to note that the information provided by the modeler is only of a type that the tooler has permitted in the original definition of the relationship. The use of diagramming fragments, and the mapping of views created by a modeler to relationships by the use of diagramming fragments causes the database to grow as the modeler works in creating a model. Information in the database can then be cross-referenced, analyzed, and otherwise manipulated through the logical model being built in the database rather than through the graphics (i.e., views) through which the modeler interfaces with the system.

Thus, while a modeler is diagramming a model instance, the system is examining the diagram to discover the fragments within it and to find corresponding fragments previously defined by the tooler. This action, plus the annotation to the diagram provided by the modeler, together provides a query mechanism enabling the system to locate in the model database that portion of a model that corresponds to the graphical view. If a corresponding model portion cannot be located in the model database, this fact is a clue to the system to create a new model instance. It is the job of the system to make the database correspond to a diagram being built by the modeler. At the same time, if an action taken by the modeler cannot be accounted for by the system, indicating that the modeler is not precisely following the methodology established by the tooler, the modeler's action is not allowed and an error indication is provided.

Figure 14:
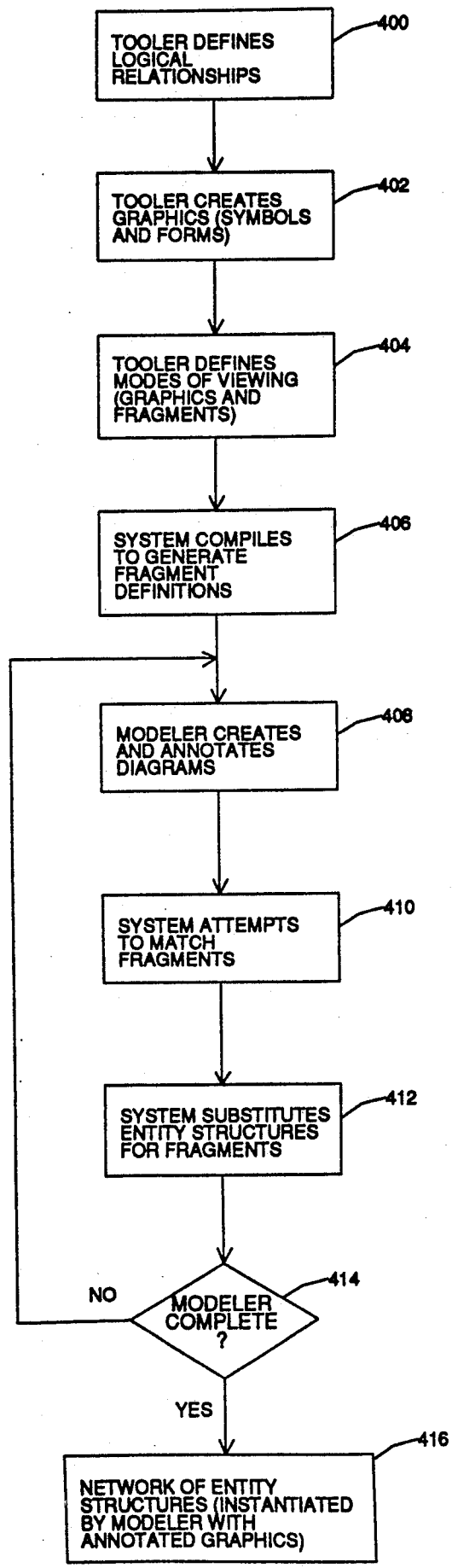
FIG. 14 is a flow chart illustrating the logical mapping performed by the modelling system using diagramming fragments.

FIG. 14 is a flow chart illustrating the sequence of operation of the system to accomplish mapping using diagramming fragments. The first step, at box 400, is the tooler's definition of logical relationships. An example of such a relationship is the sends relationship discussed above in connection with FIG. 4. The tooler also creates graphics, including symbols and forms, and places them in an "icon menu" for his own use and for subsequent use by a modeler. This step is indicated at box 402.

At box 404, the tooler defines modes of viewing the database. In this step, the tooler uses the graphics he has created and the diagramming fragments provided by the system to create a map in the nature of the diagrams a modeler will ultimately use to create model instances.

At step 406, the system compiles the meta model defined by the tooler and generates fragment definitions which are used to map specific diagrams created by a modeler to the logical relationships defined by the tooler at step 400. Various types of diagramming fragments are described below.

At step 408, the modeler steps into the picture and uses the system to create diagrams and annotate the diagrams. At step 410, the system attempts to match diagramming fragments used by the modeler with fragment definitions stored in the database. When a match is found, the system internally substitutes for the fragments the entity structures which the fragments represent. This step is indicated at box 412.

The matching of diagramming fragments used by the modeler to entity structures in the database continues until the modeler is finished diagramming, as indicated at box 414. When the modeler's task is complete, a network of entity structures results that has been instantiated by the modeler with annotated graphics, as indicated at box 416.

In a preferred embodiment of the present invention, six types of diagramming fragments are provided for use in creating compositional views. These are the placement, proximity, association, connectivity, labelled connectivity and containment fragments. Other fragments, such as context, may also be provided as necessary to enable a tooler to define a desired methodology. The setting up of a diagram fragment is accomplished by choosing graphic objects from those provided in an icon menu, and placing them in a drawing being created. The tooler fills in the text fields required for each graphic object with the relationship and role name that that object will have. This "tooler defined text information" on the objects is mapped onto the relationships and roles in the diagram on the tooler's graphic display where the view is being defined. As noted above, graphic symbols and connectors may correspond to entities, relationships, or entity structures. It is customary to think of connectors as relationships, however, it is not invalid to associate a graphic symbol to a relationship and a connector to an entity.

Turning now to the various diagramming fragments that can be used by a tooler in defining compositional views, the placement fragment is set up simply by the placement of a graphic object in the drawing space on the tooler's graphic display. The placing action by a modeler would imply that the entity structure whose view is being defined contains the logical counterpart of the graphic object. The act of placing a symbol therefore creates an entity in the database with the name the modeler gives the symbol. The placement fragment definition is the symbol.

The proximity fragment is set up by connecting the associated objects to a constraining line using special proximity connectors. The constraining line is a special connector that is used to define the area away from or within which the objects must be located to form the logical relationship. Two connectors are associated with the proximity fragment. One is for the reference object, and the other for the object related spatially to the reference object. The constraining line and proximity connectors are found in an icon menu provided in the modelling system.

The constraining line can be used to form either a line, bracket, open or closed box. The proximity connectors are used to connect the objects to the constraining line. The fragment makes the statement "when an object is spatially related to the reference object in the manner specified, establish these relationships". To test if two graphic objects in a modeller's diagram meet the spatial constraints of a proximity fragment, an imaginary constraining line is created that has the same orientation to the reference object as in the fragment. The other object is then tested to see if it has the required orientation to the imaginary constraining line. The method of testing against the imaginary line depends on whether the constraining line created an open or closed area. For a closed area, the test merely determines if the symbol is within the area. For an open area, the test determines if the symbol is on the right side of the constraining line. Thus, for example, the constraining line can be used to specify that an object must be on a particular side of the other object, i.e., symbol B must be below symbol A. To do this, the fragment would draw a horizontal constraining line between the two symbols and connect symbol A to the constraining line with the reference proximity connector, and connect symbol B to the constraining line with the related proximity connector.

When a symbol is placed in a diagram, there may be many symbols that satisfy a proximity fragment with the new symbol. If a left-right proximity fragment exists, for example, there may be symbols to the left or right of the new symbol. In these cases, the closest object to the new symbol is chosen.

Objects satisfying the proximity fragment can be optionally associated graphically. This feature is useful to associate data to connectors in structured charts to indicate data transfer between connected objects.

The fragment definition of a proximity fragment will typically contain the parent symbol (to which a child must be proximate), the child symbol, the coordinates that establish the proximity limits, the relationship name, the parent role, and the child role.

The next type of diagramming fragment is the association fragment. In a preferred embodiment, this connector has an arrow at one end, and the graphic object pointed to by the associative connector is associated with the graphic object at the arrow-free end of the connector. The relationship and role are filled in by the tooler in the object text fields provided with the connector. Alignment of the associative connector may also be specified by the tooler. A constrained association fragment is also possible. In this instance, the constraining line can be used to create an area wherein the associated object must be placed to generate the relationship.

The connectivity fragment is the next type of diagramming fragment a tooler can use to define compositional views. This fragment is set up by connecting graphic objects with a tooler defined connector, that may have text fields associated with it enabling information to be passed between the objects. The information transmitted may be another entity. To set up the connectivity fragment, the tooler connects the graphical objects and fills in the relationship role in the text field provided with the graphic objects. The tooler also fills in the text fields of the connector indicating the relationship role. The connectivity fragment definition contains the relationship name, start symbol name and its role (i.e., "from"), the end symbol name and its role (i.e., "to"), and the connector text (i.e., role it plays or attributes).

The labelled connectivity diagramming fragment is used by the tooler in defining the modelling methodology to allow the modeler to establish an implied relationship without the objects being actually connected. This is particularly useful in large diagrams where it is not always possible to establish a connectivity fragment between two objects. Objects in a labelled connectivity fragment are connected using a tooler-defined connector to a special labelled connectivity symbol which can be retrieved from the system's icon menu. The relationship and role are filled in as with the connectivity fragment. The relationship and role for the connectors are entered on both sides of the special symbol.

The containment fragment is used to place graphic objects wholly into other graphic objects. The text fields of the graphic objects are filled in with the relationship role as described above in connection with the other proximity fragments. The containment fragment definition includes the relationship name, the container role name, the container symbol, the contained role name, and the contained symbol.

Up to this point, fragments have been described as independent things. However, a view may have multiple fragments, and a single graphical action by the modeler may invoke more than one fragment. For example, placing a symbol between two other symbols may invoke two proximity fragments, one for each symbol it is between. Although more than one fragment is involved, the two fragments do not effect each other. There are cases, however, when one fragment depends on another, such that it can exist only in the context of another fragment. These complex fragments are referred to as "context fragments". An example in which context fragments can be used is in the modelling of a structure chart.

In structure charts, module symbols are connected to other module symbols to indicate that one module calls another. The meaning of the diagrams is influenced by the order of the modules called by a parent module. The order is implied by the left to right order of the called modules. Thus the logical module must maintain which modules call which modules and the order of the calling. In the present example, the model will store this information with two relationships. One is a "calls" relationship between two modules. The other is a "follows" relationship between two modules which indicates an ordering.

The next step is to define the fragments to map to these relationships. Two fragments are needed, first a connectivity fragment to map the "calls" relationship, and second a left-right proximity fragment to map to the "follows" relationship. However, the two fragments cannot be defined as independent fragments because if they were, the "follows" fragment would be erroneously invoked whenever two module symbols were near each other, regardless of whether they are connected to the same calling module. The "follows" relationship is only valid when the modules are called by the same parent. Therefore, the "follows" proximity fragment must be set up in the context of the "calls" connectivity fragment. To do this, a context fragment is defined by the tooler which defines both fragments, rather than defining two independent fragments.

The use of context fragments is not restricted to the above example, or even to the types of fragments used in the example. Any type of fragment can set up a context for any type of fragment. Further, the number of fragments involved in a context fragment is not restricted. A tooler can specify any number of levels of context, to express things such as "if A is connected to B, and B is in proximity to C, then the proximity of C to A invokes another fragment".

In addition to defining composition views as indicated at box 202 in FIG. 10a, a tooler can define network views. A network view is similar to a composition view of an entity structure in that it is a method to correlate graphical actions to consequences in the logical model. It also reflects the logical interrelationships between the objects in the database and can be used as a navigational aid through the database diagrammatically. The tooler defines the view types and the modeler creates view instances of a view type to create the actual network.

A complex network can be split up into several view instances. A network of view instances reduces the complexity of the network. A structure chart is an example of a network view. Information (i.e., objects) passed between network nodes are also part of the view.

Since a large network will exist in several view instances, an object in one view must be allowed to reference other objects that precede or follow in the network. The modeler uses off-page reference symbols to indicate a previous or next object along the link.

Another type of view that the tooler can define, as indicated at box 202 of FIG. 10a, is a map view. These are views of map types that define navigation maps which the modeler can use to navigate through a tree. The tree can either represent an entity structure decomposition, or a simple parent-child relationship in which the parent can also be a child, thus defining a tree.

After a tooler has defined the view objects necessary for the methodology, the tooler might decide to create menu objects, as indicated at boxes 204 and 206. Menus and submenus are used by the modeler in creating models according to the methodology established by the tooler. There are three places where menus are used. One is the object menus which are used to edit objects. Another is the icon menus which are used in diagramming windows, and the last is report menus, which group tooler defined special reports and functions into menus and submenus. The tooler can also allow modelers to create menus.

As noted at box 206, the tooler can define object menus, or report menus, or icon menus, or query menus, or help menus. An object menu consists of a list of object or object menu means. Report menus are similar to object menus, and list various reports that can be run. An icon menu groups icons together into a menu that is available for use by a modeler when in the diagramming mode. The icon menu can contain icons representing symbols and lines, or it can contain other icon menus. Query menus have the names of tooler-defined queries for querying a model instance created by a modeler. Help menus provide the modeler with a menu interface for help in using the system.

After defining such menus, the tooler might create query objects for use in associating query input forms and programs to queries. This is indicated at box 212 of FIG. 10b, arrived at via boxes 208 and 210 of the flow charts. After specifying queries at box 214, the tooler is given the opportunity to define report objects at box 216. These objects are used to associate structured query language report programs and the corresponding input and output forms to the report. Complicated reports can be handled using Prolog programs. After specifying such reports at box 218, the tooler can define form objects at box 220.

A form is an application specific, tooler definable interface allowing easy data entry by a modeler and clear output presentation. Forms can be defined for logical objects and for queries and reports. In the case of objects (i.e., entities, relationships and entity structures), the form fields must be related to the name and attribute fields of logical objects. For queries, the entry field must be tied into the qualifying fields of the query language used. As indicated at box 222, the tooler can define object forms, or query forms, or report generation forms, or report presentation forms, or modeler definable forms. Object forms define forms for entities, relationships and entity structures. Report generation forms are used for generating reports, and report presentation forms are used to define how the output of a report will appear. The tooler can also allow a modeler to create forms by setting up modeler definable forms.

After form objects are defined, the tooler may decide to define help text objects used to provide help information about the project or pieces thereof, as indicated at box 224. The help is typically organized such that a hierarchy of menus is presented to the modeler to isolate the help information required. After specifying help text objects at box 226, the tooler is given the opportunity to terminate the object edit mode of the logic tool program at box 228. If the tooler does not wish to terminate this mode of operation, box 232 loops back to box 184 in FIG. 10a indicating that additional object editing can be undertaken. If the tooler wishes to terminate the object editing, box 230 returns to box 162 of the Logic-Tool program in FIG. 9.

Figure 11:
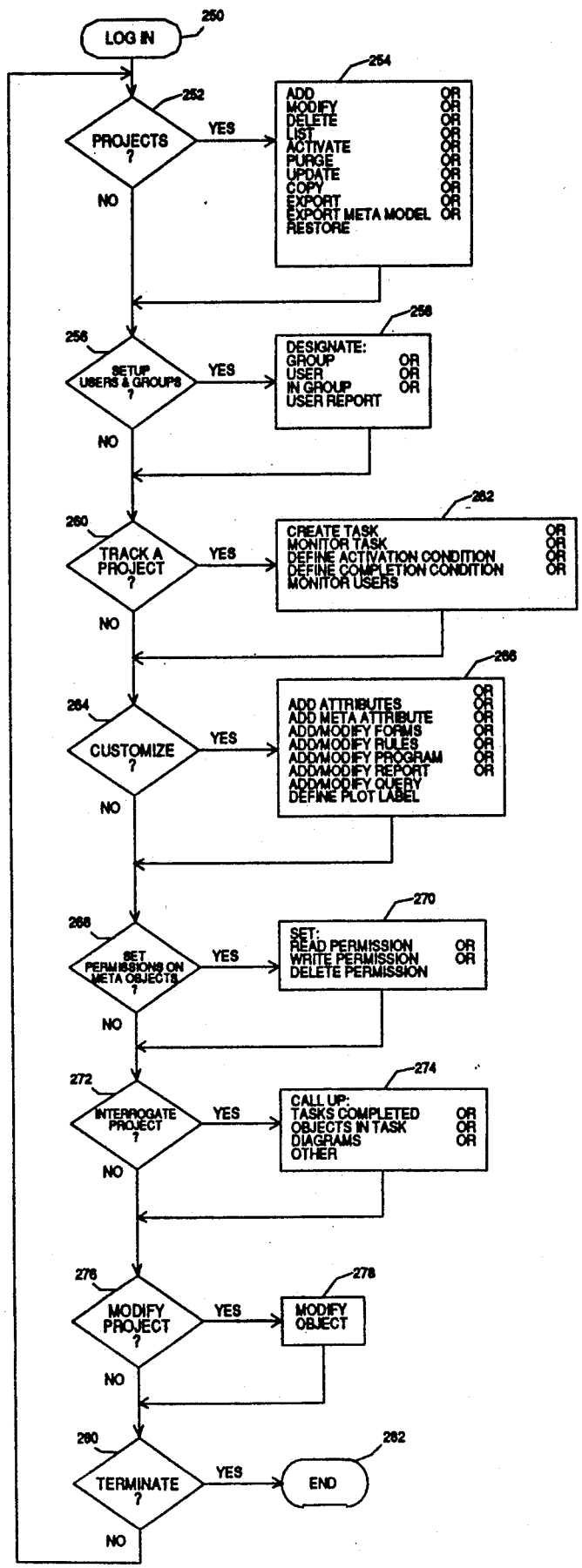
FIG. 11 is a flow chart of the "ModelManage" procedure of the modelling system, which enables a high level user to establish policies of coordination among a plurality of modelling sessions of one or more low level users.

FIG. 11 is a flow chart of the "ModelManage" program embodied in the system of the present invention. The present modelling system is intended to be used in a team environment with many active projects. Thus, concurrent access to the database must be provided to all members of a group working on a project. In order to accomplish this, the system of the present invention provides a management facility. Among other things, this facility includes controls to prevent simultaneous updating of modelling objects, views, relationships between the modelling objects and views, and model instances. It should be appreciated that when used in a single user mode, the system of the present invention does not utilize the control features of the ModelManage program.

Management of the model is done by a high level user which may be either the tooler or another individual referred to as a "model manager". The model manager uses the meta model provided by the tooler to create an actual project instance, and assigns workers to the project, creates tasks within the project, assigns workers to the tasks, and sets up permissions to pieces of the project. The model manager can create tasks which are composed of other, smaller tasks to decompose a project into smaller and smaller units.

After logging into the ModelManage program as indicated at 250 in FIG. 11, the model manager is able to work with projects as indicated at box 252. When in this mode of operation, the model manager can add, or modify, or delete, or list, or activate, or purge, or update, or copy, or export projects. He can also export the meta model to a different file, or restore a project that gets corrupted due to disk failure or the like. The list option creates a window containing all projects matching the value specified in a form input by the model manager. Activate makes the indicated project the active one. The purge option asks the manager to enter a version number or numbers to purge, and the database is then cleaned up and all the old versions deleted. Update modifies a project to reflect changes made to the corresponding meta model. This is used when the tooler releases a new version of the meta model. Copy enables the model manager to enter a new project name to which the project is copied to. Export asks the manager for a file name to export to, and the project is dumped in an ASCII file to the specified file name.

After the projects phase is complete, the model manager might set up users and groups that can access projects to work with, as indicated at box 256. As designated at box 258, the model manager can designate a group to work on a project, a user to work on a project, the option "in group" to add or remove users from previously defined groups, or the option "user report" to monitor tasks which a particular user is assigned to.

At box 260, the model manager can utilize a project tracking mechanism to divide a project into tasks, assign people to these tasks and monitor the progress of the tasks. Tasks can be composed of other tasks. Thus, in a project there is one task representing a whole project that contains subtasks which in turn contains subtasks. A certain minimum set of attributes for tasks is provided, including the task name, task status, the users who are assigned to the task, and the like. Optional activation conditions and completion conditions can be provided which are, in effect, triggers that run automatically to coordinate what is to be done and when. Other attributes for project tracking can be added to tasks by the model manager.

To define the task dependencies, the model manager creates a diagram for the tasks, and connects the dependent tasks. If there is no special activation condition, then a task becomes active when all the tasks it is dependent on are complete. If a more complicated activation condition is required, then the model manager can add a Prolog program to express the condition. Similarly, a Prolog program can be added to express the condition for when to consider the task complete. As soon as a task becomes complete, all tasks that are dependent thereon are tested to see if all their activation conditions are met. If they are, the system automatically activates the task by setting its status to "in progress". In a preferred embodiment, worksheets are maintained for all users. A worksheet keeps track of all the users' active tasks, and as tasks are completed or activated, the worksheets for the appropriate users are updated. Whenever a user connects to a project, the worksheet for that user is accessible. If the worksheet has changed since they last worked on the project, a message to check the worksheet will be provided. In this manner, as tasks become complete, other tasks dependent on prior tasks are activated. Modelers are notified when new work is available, and the completion of their work will automatically notify other modelers who can then continue with their tasks.

As noted at box 262 of FIG. 11, the model manager can create a task, or monitor a task, or define activation conditions, or define completion conditions, or monitor users.

At box 264 of FIG. 11, the model manager is given the opportunity to customize a project to a particular need. Attributes can be added to objects in the meta model, and forms and reports can be added and modified. Plot labels can be added to views, since plot labels are typically specific to a particular project instance. As indicated at box 266, when in the customizing mode, a model manager can add attributes, or add meta attributes, or add/modify forms, or add/modify rules, or add/modify programs, reports, or queries, or define plot labels.

At box 268, the model manager can set permissions on objects in the meta model ("meta objects"). Permissions on meta objects are different than permissions on instance objects. On meta objects the permissions indicate what users can do to instances of the meta object.

By setting read permissions, write permissions, or delete permissions as indicated at box 270, the tooler can restrict which pieces of the meta model a user can look at and update.

For example, a model manager can make some attributes of objects visible to all users but modifiable by only one group. Similarly, some attributes in objects could be invisible to all but one select group by giving no permissions to the world, and read/write and delete privileges to the owning group.

A model manager can also interrogate a project as indicated at box 272. The manager can query a project to look at tasks completed, objects in tasks, bring up diagrams of objects, and the like.

Projects may also be modified by the model manager, as indicated at box 276. Since the model manager is a high level user, the modification of a project can comprise modification of an object, as indicated at box 278.

At box 280, the model manager is given the option to terminate the model manage program. If termination is desired, the program is ended at box 282.

Once the tooler creates the meta model, and the model manager establishes the coordination for use of the meta model, the modeler can use the system to create model instances. The modeler interfaces with the database using a program referred to as "ModelView". Using this program, the modeler creates, deletes, or updates entity, relationship and entity structure instances. In a preferred embodiment, each entity has a unique name and associated attribute values. Relationships are used to form associations between entities, and also have attributes. Roles define the function of an entity in a relationship.

Both entities and relationships have constraints. Entity constraints are limitations on the values of its attributes, while relationship constraints are limitations on attribute values and the type of mapping between the related entities. Mapping can be one to one, one to many, or many to many. The entities, relationships and entity structures associated with projects reside in the model database. When a modeler executes a session on his workstation, a small subset of these modelling objects are resident locally, and the modeler can check in or check out the objects from the database. Objects checked out by a modeler are not available for modification to other modelers at that time. Other modelers may, however, be allowed to view such objects.

Also in a preferred embodiment, a hierarchy map is provided to guide the modelers through the system. The map is used to navigate graphically through entities or entity structures that play roles in any recursive relationship. The map displays the hierarchy tree starting at some specified node. A graphical view displaying the composition of entity structures (i.e., the graphical objects representing entities, relationships and entity structures) is also available. This view provides the diagram interface to create or update entities and relationships. Graphical actions are translated into logical actions to manipulate the database. A network view displays objects as part of a large network of entities, relationships, and entity structures.

Figure 12A:
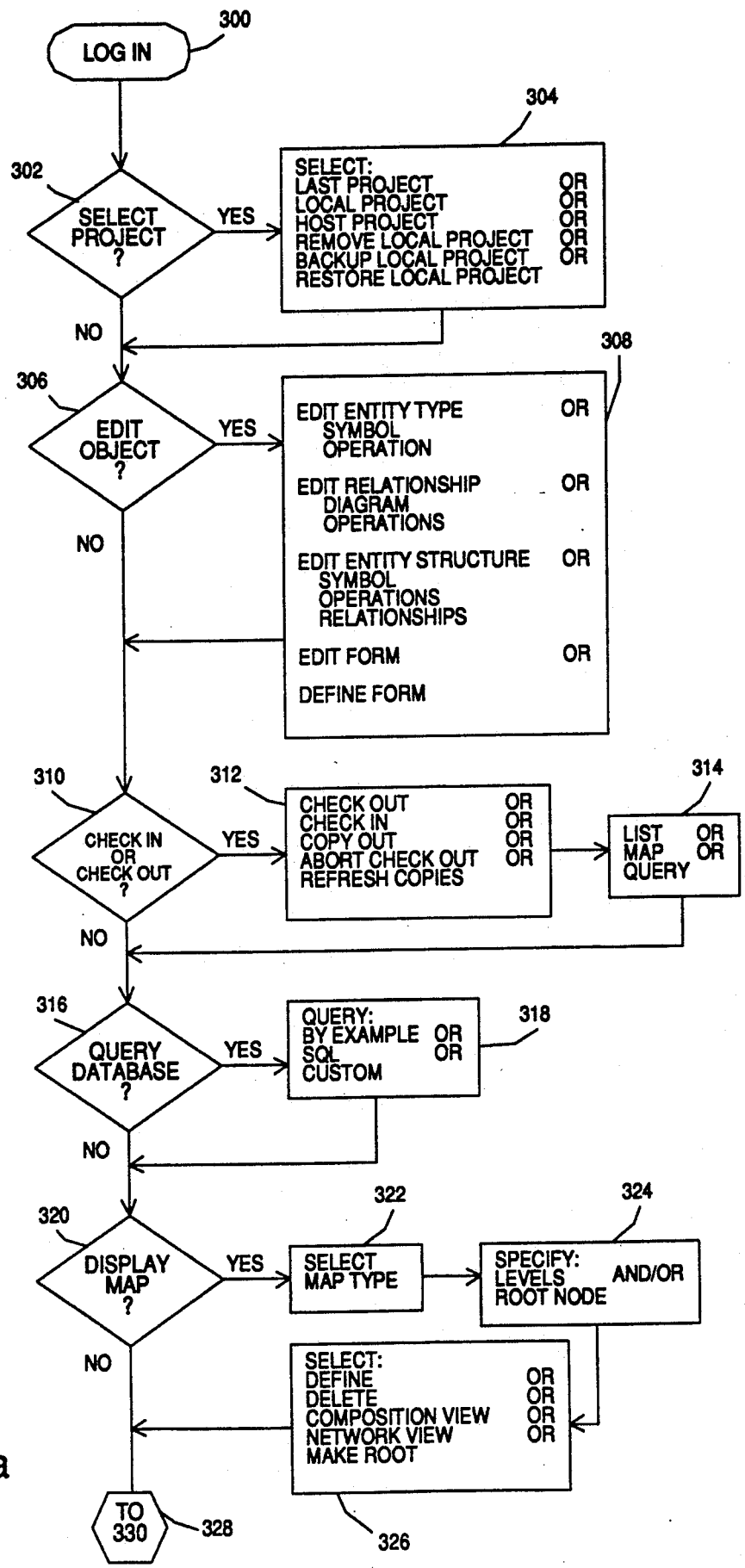
FIGS. 12a and 12b are a flow chart of the "ModelView" procedure of the modelling system, which enables system users to create actual models based on a modelling methodology and which provides diagramming capability within the modelling system.
Figure 12B:
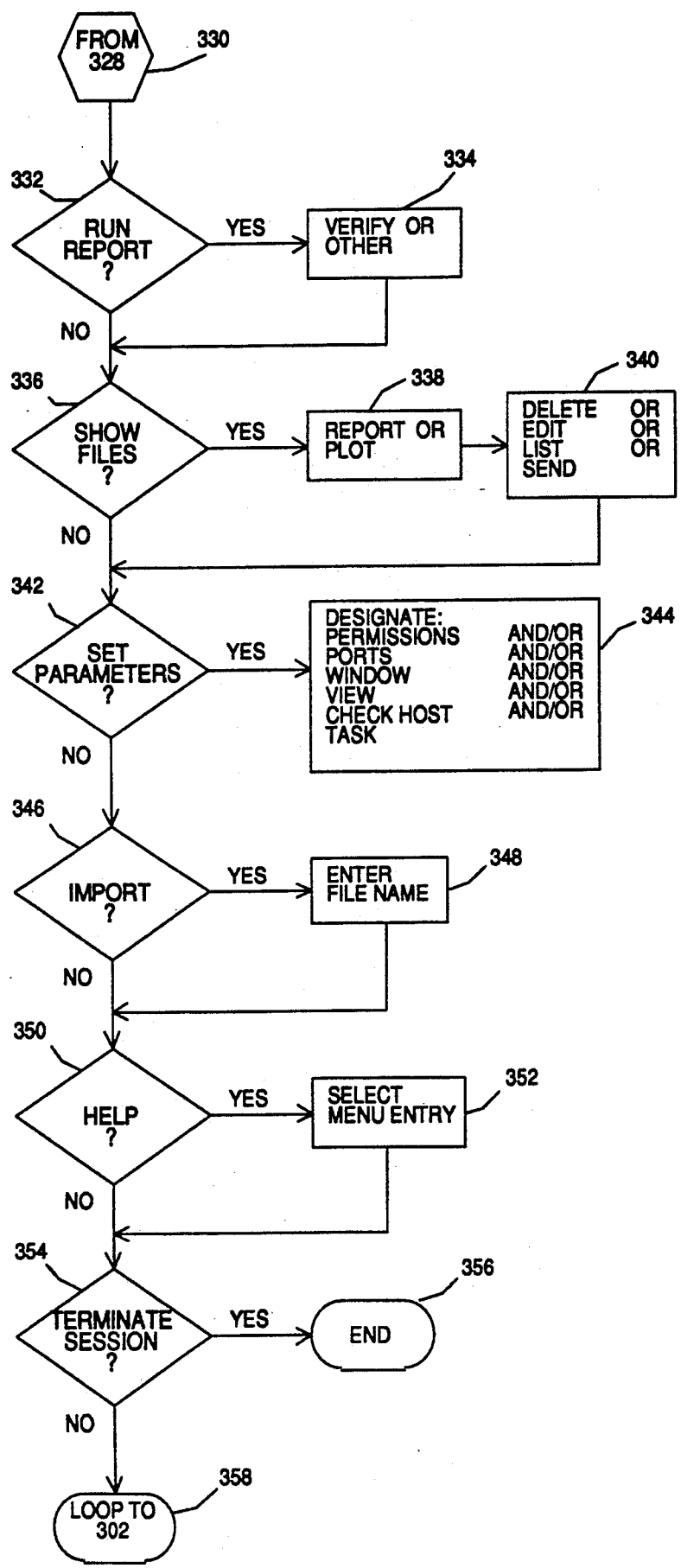

The flow chart of FIGS. 12a and 12b illustrates the ModelView program. The modeler logs into the program at box 300, and at box 302 the modeler can select a project to work on. As indicated at box 304, the modeler can select the last project he worked on, or a local project other than the last one worked on, or start a new project instance by selecting "host projects", or remove a project from the local environment, or back up a local project onto bulk storage, or restore a project from bulk storage.

After selecting a project at box 304, the modeler has the option at box 306 of editing an object. As indicated at box 308, the modeler can edit an entity type, including an entity symbol or entity operation such as add, modify, delete, rename, list, verify, network view, or show form. The modeler can also edit a relationship including a relationship diagram consisting of the relationship symbol and connected entity symbols, or a relationship operation such as add, modify, delete, list, verify, network view, or show form. When in the edit object mode, the modeler can also edit an entity structure, including the entity structure symbol, operations performed on the entity structure (including add, modify, delete, rename, list, composition view, network view, and show form), and entity structure relationships. The modeler can also edit forms for use in creating models, and define new forms as indicated in box 308.

At box 310, the modeler is given the opportunity to check in local objects into the host database, or to check out objects from the host database into the local environment. The permitted actions, as indicated at box 312, are to check out, or check in, or copy out, or to abort a checkout, or to refresh copies. These acts are essentially the same as described in connection with the LogicTool program in the flow chart of FIG. 9, box 166. After selecting one of the check-in or check-out operations, the user can select entities, relationships, and entity structures using the list function as indicated at box 314. The modeler can obtain the hierarchy map of the database using the map function, and can generate a query on the local or host database using the query function.

As indicated at box 316, the modeler can query objects in the database using a query database option. Such queries may be made by example, or by structured query language ("SQL"), or custom queries can be defined as indicated at box 318. The query by example mode presents the symbol interface for querying. The fields of the object symbols are used to construct the query. The custom query option provides the modeler with tooler-defined forms for custom-tailored queries provided in the methodology.

At box 320, the modeler is enabled to display a map of the database. The map is a tree with each node being an entity or entity structure, and is based on a recursive system defined or tooler defined relationship. The modeler uses the map to navigate through the database graphically. Another use of the map is the viewing of a network of view object instances. These view instances are related to one another via the off-page reference relationship. Thus, the view instances define a single large network and each view instance defines a part of the network.

The modeler selects one of several map types at box 322, and is then prompted for the root object name and the number of levels to be displayed, as indicated at box 324. At box 326, the modeler can perform several operations on any object appearing in the hierarchy tree. The "define"0 option is selected to update the attribute values of the object. The "delete" option is selected to delete the object instance from the database. "Composition view" is selected to obtain a compositional view of the object instance. Similarly, "network view" is selected to obtain a network view of the object instance. The selection "make root" will make the object the root of the hierarchy tree, and the hierarchy map will be redrawn with the object as the root of the map.

From box 326, the flow chart continues at box 332 of FIG. 12b via boxes 328 and 330. At box 332, the modeler can run a report on the model instance. One such program is "verify", as shown at box 334, which is used to verify all objects in the model. Other predefined programs may also exist, as defined by the tooler when constructing the modelling methodology.

There are two kinds of system files that are generated in a preferred embodiment of the present system. These are report files resulting from programs such as verify, and plot files that store plots. At box 336, the modeler is given the option to show files, and as indicated at box 338, either report files or plot files can be shown. Operations that can be performed on either type of file are listed in box 340, and include the delete option to delete a file, the edit option to edit report files, the list option to list the files matching a specified template, and the send option to transmit the report file to a printer or the plot file to a plotter.

At box 342, a modeler is enabled to set model view system parameters, including tick size, default permissions, plotter/printer port, and window size, as shown in box 344. View type parameters can also be set up. The check host parameter can be set to instruct the system to check if any object that is being added to the local database exists in the host database. The modeler uses the task parameter to identify the current task that is being worked on.

The import option provided to a modeler at box 346 is used to import object instances from files. At box 348, the modeler enters the file name for importing object instances.

At box 350, a help option is provided so that the modeler can obtain help information. At box 352, the modeler selects the desired help information from a menu.

The modeler can terminate a session at box 354. If the session is to be terminated, it ends at box 356.

Figure 13:
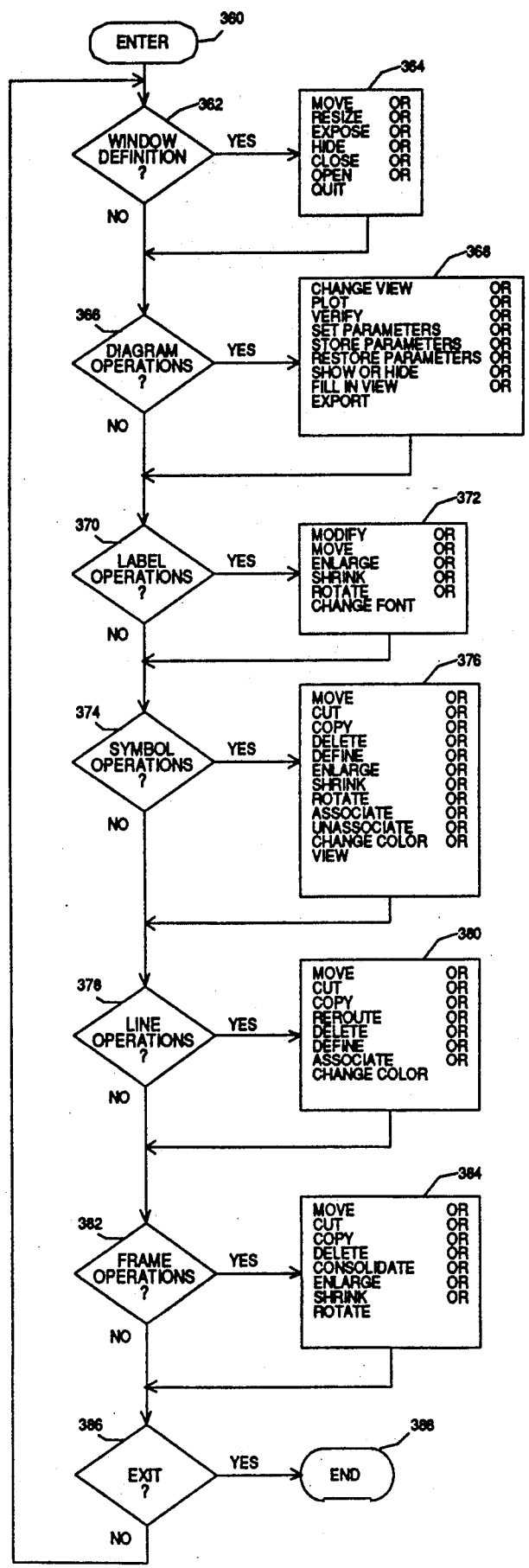
FIG. 13 is a flow chart of the diagramming mode of the modelling system of the present invention.

FIG. 13 is a flowchart illustrating the diagramming mode used by toolers, model managers, and modelers in connection with the system of the present invention. The diagramming mode is entered at box 360, and at box 362 the user can define a diagramming window on his or her graphic workstation. As indicated at box 364, the user can move windows within the display area, or resize windows, or expose a window, hide a window, close a window, open a window, or quit the window definition routine.

At box 366, a user can perform diagram operations, as indicated at box 368. These operations include "change view" which enables the user to pan, encompass, zoom in, zoom out, or navigate around a diagrammatic view. If the user selects the plot function, a plot frame is displayed in the user's window that can be dragged around and placed. Using the verify option causes all rules for the entity structure to be checked on the logical side of the entity structure, but not on the graphical view. Any rule violations are reported to the user.

When a view initially comes up, parameters are set to certain default values provided in the methodology (or in the system) for the view type. These settings can be changed for particular views using the set parameters option as indicated at box 368. The new parameters can be stored or restored to reflect previously stored parameters, if any.

The show or hide function indicated in box 368 is used to make objects of the same type invisible in a diagram. Using show, object instances can be made to appear in the view. Using hide will cause the object instances to vanish from the view. This function is useful for dealing with detailed diagrams, where hiding a few objects adds to the clarity of the diagram.

An entity structure may have several views, and it is possible that a view of a certain type may have been previously defined. This implies that the logical objects that comprise the entity structure are known. The view instance corresponding to the current view type, however, may not have been defined. Using the fill in view option indicated at box 368, a modeler can fill in a view semi-automatically. On selecting an object instance, the system will fill in names, connect the symbol with other symbols, and aid the modeler to the extent possible in creating the desired view. Similarly, on selecting a relationship, if the objects in the relationship are already in the view, the modeler need only place the connector. This semi-automatic generation of views is useful in the transformation of one view instance of a certain type into another view of another type.

The export operation designated in box 368 is used to export a diagram to a file. The export is executed once the modeler enters the file name.

At box 370, the system user can perform label operations, as specified in box 372. A label is text associated with a symbol, a line or an arc. Labels may be modified, or moved, or enlarged, or shrunk, or rotated, or the font of the label can be changed.

At box 374, the system user can perform symbol operations as designated in box 376. The symbol operations include moving a symbol, cutting a symbol, copying a symbol, deleting a symbol, defining a symbol, and enlarging, shrinking or rotating a symbol. Symbols may also be associated with other symbols, in which event a child symbol is selected and the current symbol becomes its parent. If the unassociate option is selected, the symbol is no longer associated with its parent. These functions are only available if the methodology permits the symbol to be associated with another symbol.

The change color option indicated at box 376 enables the user to select a color for the symbol, in which event all its labels are changed to that color. The view function is available to provide a composition view if the symbol represents an entity structure that can be viewed.

Similar operations can be performed on lines, as indicated at boxes 378 and 380. Lines can be moved, cut, copied, rerouted, deleted, defined, associated, and the colors thereof can be changed.

Frame operations can also be completed as indicated at boxes 382 and 384. Frames can be moved, cut, copied, deleted, consolidated, enlarged, shrunk, and rotated.

When a diagramming session is complete, the user can terminate the session as indicated at boxes 386 and 388. If a session is not to be terminated, the diagramming can be continued by choosing additional options.

It should now be appreciated that the present invention provides a logical modelling system and method for logical modelling wherein a tooler can provide a modelling methodology to be used in the creation of evaluatable models. The graphic interface to the system is a form of communication to and from the database. The system provides views of the database through the graphical interface, wherein the path between the model database and the models created is a set of mappings implemented through diagramming fragments. In creating modelling methodologies, the tooler defines a set of objects at a primitive level that instance models can later be defined in terms of, the types of views that the modeler can use to work with the database, and a set of mappings between the database and the views provided to the modeler. Attributes, including dynamic attributes written in a language such as Prolog, can be placed on entities and relationships in the database. Thus, the present system provides a powerful logical database editor having a graphic interface.

Those skilled in the art will appreciate that models generated using the present system and method are not limited to any particular application area. Rather, the system is a general system that can be used for modelling in virtually any domain. The present system and method can be used to create expert systems, without first creating an inference knowledge base by defining entities, relationships, attributes, and entity structures relating to information in the knowledge base.

A software listing implementing the system of the present invention is attached hereto as a microfiche appendix. The program listing is a hexadecimal dump of the object code, and can be executed on a Sun Microsystems computer, Model No. 3/50 or 3/60, using the SUN Microsystems UNIX Version 3.5 or 4.0 operating system and the NeWS Windowing System Version 1.1 from Sun Microsystems.

Although the present invention has been described in connection with a preferred embodiment thereof, many variations and modifications can be made. It is intended to cover all such variations and modifications that fall within the scope of the present invention, as defined in the following claims.

What is claimed is:

1. A computer based modelling system comprising:
   a computer processor;
   means coupled to said computer processor for storing a model database;
   a set of primitives stored in said database;
   interface means coupled to said computer processor for enabling a user to input, retrieve, and manipulate data within said database; and
   tooling means responsive to said interface means for enabling a high level user of said modelling system to create a modelling methodology by editing said database to define:
   (a) modelling objects in terms of said primitives,
   (b) a mode of viewing said modelling objects, and
   (c) logical relationships between elements of said modelling objects and views thereof.

2. The modelling system of claim 1 wherein said tooling means enables said high level user to define a plurality of modes of viewing said modelling objects.

3. The modelling system of claim 1 wherein said primitives comprise:
   entities,
   relationships for associating entities, and
   attributes for setting conditions on entities and relationships.

4. The modelling system of claim 3 wherein said modelling objects include entity structures.

5. The modelling system of claim 1 further comprising:
   modelling means responsive to said interface means for enabling a low level user to create models for specific applications by:
   (a) selecting views representative of modelling objects stored in said database; and
   (b) manipulating said views in accordance with said methodology.

6. The modelling system of claim 5 wherein said views comprise forms, and wherein said low level user manipulates said forms by entering information thereon.

7. The modelling system of claim 6 wherein said views also comprise graphic elements, and wherein said low level user manipulates said graphic elements by connecting them to forms or other graphic elements.

8. The modelling system of claim 5 further comprising:
   management means, responsive to said interface means, for enabling said high level user to establish policies of coordination among a plurality of modelling sessions of one or more low level users by defining modelling objects, views thereof, and logical relationships between said objects and views representative of:
   (a) low level users,
   (b) low level user tasks, and
   (c) low level user results.

9. The modelling system of claim 5 further comprising:
   means for evaluating a model created with said modelling means to determine its performance in an intended application for which the model was created.

10. The modelling system of claim 5 further comprising:
    verification means coupled to said computer processor for testing manipulations of views attempted by said low level user to verify their compliance with said methodology; and
    means responsive to said verification means for prohibiting invalid manipulations.

11. The modelling system of claim 1 wherein said model database has a recursive structure, whereby a change made to a first object contained in the database will initiate corresponding changes in every other object logically related to the first object.

12. The modelling system of claim 11 wherein a change made to a view derived from said database will initiate corresponding changes in every other object or view logically related to the derived view.

13. The modelling system of claim 12 wherein said primitives comprise:
    entitles;
    relationships for associating entities; and
    attributes for setting conditions on entities and relationships;
    said system further comprising:
    means, responsive to said interface means, for enabling said high level user to define additional attributes that are dynamic in nature for use in verifying the propriety of changes made to objects or views.

14. The modelling system of claim 1 wherein said interface means is a graphical interface.

15. The modelling system of claim 1 wherein said logical relationships between elements of said modelling objects and views thereof are defined using diagramming fragments.

16. A method for creating modelling methodologies to enable a modeler to build evaluatable models for intended applications comprising the steps of:
    providing a set of primitives including:
    (a) entities, (b) relationships for associating entities, and
(c) attributes for setting conditions on relationships;
storing said primitives in a model database;
creating modelling objects from said stored entities, relationships and attributes;
storing said modelling objects in said database;
establishing modes for viewing said stored modelling objects;
defining logical relationships between elements of said modelling objects and views thereof;
storing said logical relationships in the database; and
providing a user with access to said modelling objects through views thereof, to enable the user to create models for an intended application by manipulating said views to edit entities and relationships in said model database in accordance with a methodology defined by the types of modelling objects provided, and the relationships and attributes applicable thereto.

17. The method of claim 16 wherein said step of creating modelling objects comprises the further steps of:
defining entity structures; and
storing said entity structures as modelling objects in said database.

18. The method of claim 16 wherein said step of creating modelling objects comprises the further steps of:
specifying rules; and
associating said rules to modelling objects.

19. The method of claim 16 wherein said step of creating modelling objects comprises the further steps of:
defining functions; and
storing said functions in said database.

20. The method of claim 16 wherein said step of creating modelling objects comprises the further steps of:
defining graphic objects; and
storing said graphic objects in said database.

21. The method of claim 16 wherein said step of creating modelling objects comprises the further steps of:
defining menu objects; and
storing said menu objects in said database.

22. The method of claim 16 wherein said step of creating modelling objects comprises the further steps of:
defining query objects, and
storing said query objects in said database.

23. The method of claim 16 wherein said step of creating modelling objects comprises the further steps of:
defining report objects, and
storing said report objects in said database.

24. The method of claim 16 wherein said step of creating modelling objects comprises the further steps of:
defining form objects, and
storing said form objects in said database.

25. The method of claim 16 wherein said step of creating modelling objects comprises the further steps of:
defining help text objects, and
storing said help text objects in said database.

26. The method of claim 16 comprising the further steps of:
establishing policies of coordination among a plurality of modelling sessions of one or more users.

27. The method of claim 26 wherein said policies of coordination are established by defining modelling objects, views thereof, and logical relationships therebetween representative of:
(a) users;
(b) user tasks; and
(c) user results.

28. A computer modelling system having a graphical interface to a model database, comprising:
first tooler means for defining groups of objects and logical relationships between said objects in a model database;
second tooler means, coupled to said model database, for creating diagram fragments and mapping said diagram fragments to corresponding groups of said objects and relationships in said database;
modeler means coupled to said database for creating a composite diagram containing a plurality of said diagram fragments; and
mapping means for identifying in said composite diagram said plurality of diagram fragments, and mapping said diagram fragments to the corresponding group of objects and relationships in said model database to define a model instance.

29. The modelling system of claim 28 wherein said first tooler means defines said objects by icons and defines said relationships by connectors between said icons.

30. The modelling system of claim 28 wherein said diagram fragments are mapped to the corresponding groups of objects and relationships by titles associated with said graphic objects, said objects and relationships between objects having the same or corresponding titles.

* * * * *